US011809652B2

(12) United States Patent
Hwang

(10) Patent No.: US 11,809,652 B2
(45) Date of Patent: Nov. 7, 2023

(54) TOUCH DISPLAY DEVICE, GATE DRIVING CIRCUIT AND TOUCH DRIVING METHOD

(71) Applicant: LG Display Co., Ltd., Seoul (KR)

(72) Inventor: Sujin Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/054,868

(22) Filed: Nov. 11, 2022

(65) Prior Publication Data

US 2023/0214037 A1    Jul. 6, 2023

(30) Foreign Application Priority Data

Dec. 31, 2021    (KR) .......................... 10-2021-0193791

(51) Int. Cl.
| | | |
|---|---|---|
| *G06F 3/041* | (2006.01) | |
| *G09G 3/3225* | (2016.01) | |
| *G09G 3/3266* | (2016.01) | |
| *H10K 59/40* | (2023.01) | |
| *G09G 3/36* | (2006.01) | |
| *G06F 3/044* | (2006.01) | |

(52) U.S. Cl.
CPC ........ *G06F 3/0412* (2013.01); *G06F 3/04166* (2019.05); *G09G 3/3225* (2013.01); *G09G 3/3266* (2013.01); *H10K 59/40* (2023.02); *G06F 3/044* (2013.01); *G09G 3/3648* (2013.01); *G09G 2300/0842* (2013.01); *G09G 2310/0202* (2013.01); *G09G 2310/08* (2013.01); *G09G 2320/0223* (2013.01); *G09G 2354/00* (2013.01)

(58) Field of Classification Search
CPC .... G06F 3/0412; G06F 3/04166; G06F 3/044; G09G 3/3225; G09G 3/3266; G09G 3/3648; G09G 2300/0842; G09G 2310/0202; G09G 2310/08; G09G 2320/0223; G09G 2354/00; H10K 59/40
See application file for complete search history.

(56) References Cited

U.S. PATENT DOCUMENTS

| | | | |
|---|---|---|---|
| 2017/0269769 A1* | 9/2017 | Hu | ......................... G09G 5/003 |
| 2018/0033391 A1* | 2/2018 | So | ......................... G09G 3/3696 |
| 2020/0074937 A1* | 3/2020 | Choi | .................... G09G 3/3266 |
| 2020/0135115 A1* | 4/2020 | Chang | .................. G09G 3/3266 |
| 2022/0011895 A1* | 1/2022 | Park | ...................... G06F 1/3265 |

* cited by examiner

*Primary Examiner* — Hong Zhou
(74) *Attorney, Agent, or Firm* — Seed IP Law Group LLP

(57) ABSTRACT

Embodiments of the present disclosure relate to a touch display device, a gate driving circuit and a touch driving method, and more particularly may provide a touch display device comprising a display panel on which a plurality of subpixels are disposed; a gate driving circuit supplying a plurality of scan signals to the display panel through a plurality of gate lines; a touch driving circuit supplying a plurality of touch driving signals to the display panel through a plurality of touch lines and receiving a plurality of touch sensing signals generated by the display panel; and a timing controller controlling the touch driving circuit and controlling a plurality of driving modes by supplying a touch control signal for determining a display driving period and a touch driving period to the gate driving circuit.

17 Claims, 15 Drawing Sheets

TOUCH DISPLAY DEVICE, GATE DRIVING CIRCUIT AND TOUCH DRIVING METHOD

CROSS REFERENCE TO RELATED APPLICATION

This application claims priority to Korean Patent Applications No. 10-2021-0193791, filed on Dec. 31, 2021, which are hereby incorporated by reference for all purposes as if fully set forth herein.

BACKGROUND

Technical Field

Embodiments of the present disclosure relate to a touch display device, a gate driving circuit and a touch driving method.

Description of the Related Art

With the development of multimedia, the importance of flat panel display devices is increasing. In response to this, flat panel display devices such as a Liquid Crystal Display, a Plasma Display Panel, and an Organic Light Emitting Display are commercially available.

In addition, a touch display device, in which a touch panel is stacked on such a display device, that generates information corresponding to a touch point from a sense of the touch point or performs an calculation about a touch operation by using a feature that electrical characteristics such as resistance or capacitance change at the touch point where a hand or a stylus pen comes into contact, is widely used.

Such a touch display device is one of user interfaces, and its application is expanding to small portable terminals, office devices, mobile devices, and the like.

BRIEF SUMMARY

The inventors have realized that when the touch panel is separately stacked on the touch display device, the display device becomes thicker and thus there is a limitation in manufacturing it thin, a light transmission efficiency decreases by passing through the laminated touch panel, and a manufacturing cost increases. In order to solve such problems, recently, an advanced in-cell touch (AIT) type display device in which touch electrodes are embedded in pixel area of the display panel has been proposed, but improvements that work with this are needed.

A touch driving mode of such a touch display device may be divided into a VB (Vertical Blank) driving mode in which touch driving operation is performed in one vertical blank period within one display frame period, and LHB (Long Horizontal Blank) driving mode in which touch driving operation is performed in a plurality of LHB periods within one display frame period.

Since the display driving period occupies most of one display frame period in the VB driving mode, it is mainly used in a high-resolution touch display device. On the other hand, the LHB driving mode is mainly used in a touch display device with high touch sensitivity because a plurality of touch driving periods are included in one display frame period.

However, prior touch display devices have a problem in that it cannot be changed if the VB driving mode or the LHB driving mode is set at the design time.

Accordingly, embodiments of the present disclosure are directed to a touch display device that substantially obviates one or more of the problems due to limitations and disadvantages of the related art.

Accordingly, the inventors of the present disclosure invented a touch display device, a gate driving circuit and a touch driving method capable of switching touch driving modes.

Embodiments of the present disclosure may provide a touch display device, a gate driving circuit and a touch driving method capable of switching a VB driving mode or a LHB driving mode even after shipment.

In addition, embodiments of the present disclosure may provide a touch display device, a gate driving circuit and a touch driving method capable of switching touch driving modes using a touch control signal to control a touch driving period and a display driving period.

In addition, embodiments of the present disclosure may provide a touch display device, a gate driving circuit and a touch driving method capable of switching touch driving modes by controlling a gate driving circuit using a touch control signal to control a touch driving period and a display driving period.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

Embodiments of the present disclosure may provide a touch display device comprising a display panel on which a plurality of subpixels are disposed, a gate driving circuit supplying a plurality of scan signals to the display panel through a plurality of gate lines, a touch driving circuit supplying a plurality of touch driving signals to the display panel through a plurality of touch lines and receiving a plurality of touch sensing signals generated by the display panel, and a timing controller controlling the touch driving circuit and controlling a plurality of driving modes by supplying a touch control signal for determining a display driving period and a touch driving period to the gate driving circuit.

Embodiments of the present disclosure may provide a gate driving circuit configured to supply a plurality of scan signals through a plurality of gate lines to a display panel in which a plurality of subpixels are disposed, comprising a plurality of gate driving integrated circuits, wherein the plurality of gate driving integrated circuits varies a time interval at which the plurality of scan signals are generated according to a plurality of driving modes by a touch control signal for determining a display driving period and a touch driving period.

Embodiments of the present disclosure may provide a touch driving method controlling a plurality of driving modes, comprising generating a touch control signal to determine a display driving period and a touch driving period, charging a Q node level of a gate driving integrated circuit to a level of a high potential gate voltage using the touch control signal during the display driving period, supplying a scan clock signal to the gate driving integrated circuit during the display driving period, discharging the Q node level of the gate driving integrated circuit to a level of a low potential gate voltage using the touch control signal during the touch driving period, and blocking the scan clock signal during the touch driving period.

According to embodiments of the present disclosure, it is possible to provide a touch display device, a gate driving circuit and a touch driving method capable of switching touch driving modes.

According to embodiments of the present disclosure, it is possible to provide a touch display device, a gate driving circuit and a touch driving method capable of switching a VB driving mode or a LHB driving mode even after shipment.

According to embodiments of the present disclosure, it is possible to provide a touch display device, a gate driving circuit and a touch driving method capable of switching touch driving modes using a touch control signal to control a touch driving period and a display driving period.

According to embodiments of the present disclosure, it is possible to provide a touch display device, a gate driving circuit and a touch driving method capable of switching touch driving modes by controlling a gate driving circuit using a touch control signal to control a touch driving period and a display driving period.

It is to be understood that both the foregoing general description and the following detailed description are explanatory and are intended to provide further explanation of the inventive concepts.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain various principles. In the accompanying drawings.

DETAILED DESCRIPTION

Figure 1:
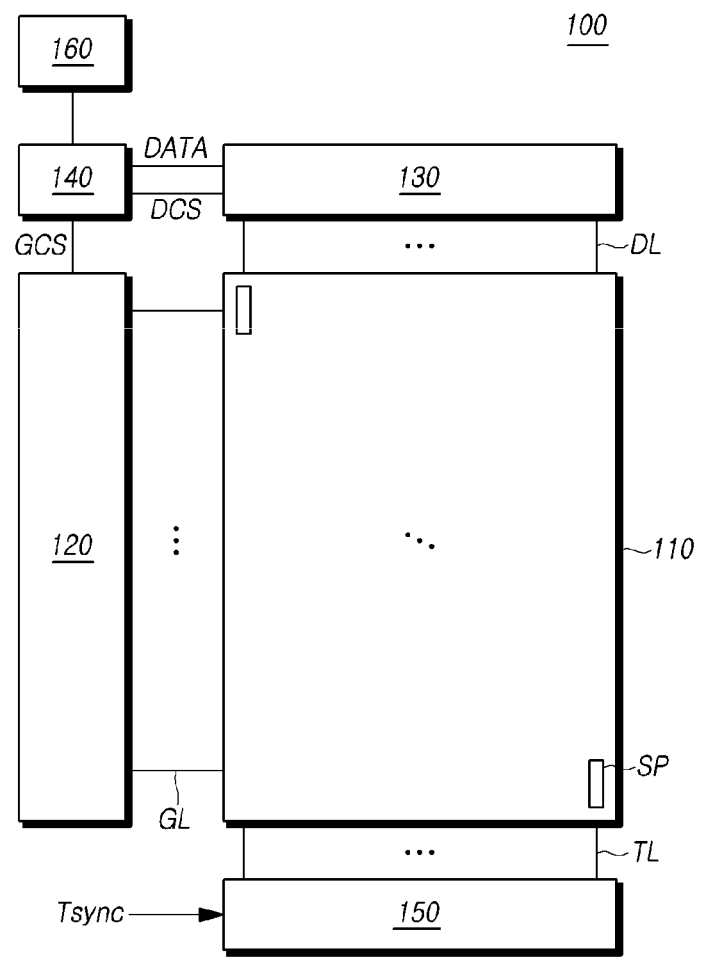
FIG. 1 illustrates a schematic diagram of a touch display device according to embodiments of the present disclosure.

Hereinafter, some embodiments of the present disclosure will be described in detail with reference to example drawings. In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein may be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure will be described in detail with reference to the accompanying drawings.

FIG. 1 illustrates a schematic diagram of a touch display device according to embodiments of the present disclosure.

Referring to FIG. 1, the touch display device 100 according to embodiments of the present disclosure may include a display panel 110, a gate driving circuit 120, a data driving circuit 130, a timing controller 140, a touch driving circuit 150 to detect a touch on the display panel 110, and a power management circuit 160.

A plurality of gate lines GL and a plurality of data lines DL are disposed in the display panel 110, and a plurality of subpixels SP are disposed in areas in which the gate lines GL intersect the data lines DL.

In addition, a plurality of touch electrodes may be disposed on or within the display panel 110, and a plurality of touch lines TL electrically connecting the touch electrodes and the touch driving circuit 150 may be disposed in the display panel 110.

As an example of describing a display driving operation in the touch display device 100, the gate driving circuit 120 controls the driving timing of the subpixels SP disposed in the display panel 110. In addition, the data driving circuit 130 supplies a data voltage corresponding to image data to the subpixels SP. Accordingly, the subpixels SP are displaying an image by illuminating luminous intensities corresponding to grayscale levels of the image data.

Specifically, the gate driving circuit 120 is controlled by the timing controller 140, and controls the driving timing of the plurality of subpixels SP by sequentially supplying scan signals to the plurality of gate lines GL disposed in the display panel 110.

The gate driving circuit 120 may include one or more gate driving integrated circuits (GDIC), which may be disposed on one or both sides of the display panel 110, depending on the driving scheme. Alternatively, the gate driving circuit 120 may be implemented with a gate-in-panel (GIP) structure directly embedded in a bezel area of the display panel 110.

The data driving circuit 130 receives digital image data from the timing controller 140, and converts the received digital image data into an analog data voltage. In addition, the data driving circuit 130 supplies the data voltage to the respective data lines DL at time which the scan signals are supplied through the gate lines GL, so that the respective subpixels SP display luminous intensities according to the data voltage.

The data driving circuit 130 may include one or more source driving integrated circuits (SDICs).

The timing controller 140 supplies a variety of control signals to the gate driving circuit 120 and the data driving circuit 130, and controls the operations of the gate driving circuit 120 and the data driving circuit 130.

The timing controller 140 controls the gate driving circuit 120 to supply the scan signals at time according to timing realized by respective frames, converts source image data received from an external source into an image data DATA with a format readable by the data driving circuit 130, and supplies the converted image data DATA to the data driving circuit 130.

The timing controller 140 also receives a variety of timing signals, including a vertical synchronization signal, a horizontal synchronization signal, an input data enable signal, a clock signal, and the like, as well as the image data DATA from the external source (e.g., a host system).

The timing controller 140 may generate a data control signal DCS and a gate control signal GCS using the variety of timing signals received from the external source, and supply the control signals DCS, GCS to the gate driving circuit 120 and the data driving circuit 130.

For example, the timing controller 140 generates a variety of gate control signals GCS, including a gate start pulse signal, a gate shift clock signal, a gate output enable signal, and the like, to control the gate driving circuit 120.

Here, the gate start pulse signal is used to control the operation start timing of one or more gate driving integrated circuits in the gate driving circuit 120. The gate shift clock signal is a clock signal commonly supplied to the one or more gate driving integrated circuits to control the shift timing of the scan signals. The gate output enable signal designates timing information of the one or more gate driving integrated circuits.

In addition, the timing controller 140 generates a variety of data control signals DCS, including a source start pulse signal, a source sampling clock signal, a source output enable signal, and the like, to control the data driving circuit 130.

Here, the source start pulse signal is used to control the data sampling start timing of one or more source driving integrated circuits in the data driving circuit 130. The source sampling clock signal is a clock signal for controlling the sampling timing of data voltage in each of the source driving integrated circuits. The source output enable signal controls the output timing of the data driving circuit 130.

The touch display device 100 may include a touch driving circuit 150 performing a touch sensing operation and stylus sensing operation using a signal received through or from display panel 110 by driving the display panel 110 with a built-in touch screen panel.

The touch driving circuit 150 may include a first circuit for supplying touch driving signals to touch electrodes arranged on the display panel 110 and receiving touch sensing signals through sensing lines SL, and a second circuit for detecting a passive touch (finger touch) or an active touch using the touch sensing signals received from the display panel 110.

The first circuit may be referred to as a touch sensing circuit (ROIC; Read-Out Integrated Circuit), and the second circuit may be referred to as a touch controller.

The touch driving circuit 150 may sense the presence and position of a touch based on a deviation in capacitance between the touch electrodes arranged on the display panel 110. That is, when a deviation in capacitance occurs between a position where a passive stylus including a user's finger or an active stylus is in contact with and a non-contact position, the touch driving circuit 150 detects the deviation in capacitance to determine the presence and position of the touch.

The timing controller 140 controls the touch driving circuit 150. The touch driving circuit 150 may generate touch driving signals based on a touch synchronization signal Tsync received from the timing controller 140. The touch driving circuit 150 transmits and receives touch sensing signals and touch driving signals according to an interface defined with the display panel 110.

The touch display device 100 may further include a power management circuit 160 for supplying various types of voltage or current to the display panel 110, the gate driving circuit 120, the data driving circuit 130, and the like, or controls various types of voltage or current to be supplied to the same.

The power management circuit 160 generates power signals to drive the display panel 110, the gate driving circuit 120, the data driving circuit 130, and the touch driving circuit 150 by adjusting DC input voltage supplied from a host system.

The data driving circuit 130 for supplying a data voltage to the data line DL may be referred to as a source driving circuit or a source driving integrated circuit (SDIC). Also, the touch driving circuit 150 may be implemented as an integrated driving circuit (SRIC) together with the data driving circuit 130.

In this case, the integrated driving circuit (SRIC) may be a COF (Chip On Film) type mounted on a film, and may be embedded in the display panel 110 or mounted on a printed circuit board (PCB).

The film on which the integrated driving circuit (SRIC) is mounted may be coupled to each of the bonding member of the display panel 110 and the bonding member of the printed circuit board (PCB).

A touch controller or the like may be mounted on the printed circuit board (PCB).

The touch driving circuit 150 and the data driving circuit 130 may be implemented as individual driving chip. The touch driving circuit 150 may be electrically connected to a plurality of touch electrodes constituting the display panel 110 through a plurality of sensing lines.

In this case, the touch driving circuit 150 may perform touch sensing operation in a touch driving period timely divided from the display driving period. Otherwise, the touch driving period in which the touch sensing operation is performed may proceed simultaneously with the display driving period.

Meanwhile, when an encapsulation layer is formed on the upper portion of the display panel 110 and a touch electrode is disposed on the upper portion of the display panel 110, capacitance for driving the touch electrode may be increased. For this reason, it may be necessary to increase the level of the touch driving signal for driving the touch electrode. For the purpose of above, a level shifter (not shown) may be added between the touch driving circuit 150 and the display panel 110 to control the level of the touch driving signal.

The subpixels SP are defined by the intersections of the gate lines GL and the data lines DL. Liquid crystals or light emitting elements may be disposed in the subpixels SP, depending on the type of the touch display device 100.

For example, in a case in which the touch display device 100 is a liquid crystal display device, the touch display device 100 includes a light source device, such as a backlight unit, to illuminate the display panel 110, and liquid crystals are disposed in the subpixels SP of the display panel 110. In addition, the touch display device 100 may display luminous intensities and an image data by adjusting the alignment of the liquid crystals using electromagnetic fields generated in response to the data voltage supplied to the subpixels SP.

In the case of a liquid crystal display device, the display panel 110 includes a liquid crystal layer formed between two substrates, and it may be operated in any known mode such as Twisted Nematic (TN) mode, Vertical Alignment (VA) mode, In Plane Switching (IPS) mode, or Fringe Field Switching (FFS) mode. On the other hand, in the case of an organic light emitting display device, the display panel 110 may be implemented in a top emission type, a bottom emission type, or a dual emission type.

In addition, the touch display device 100 according to embodiments of the present disclosure may detect a user's touch on the display panel 110 using the touch electrodes TE included in the display panel 110, and the touch driving circuit 150.

Figure 2:
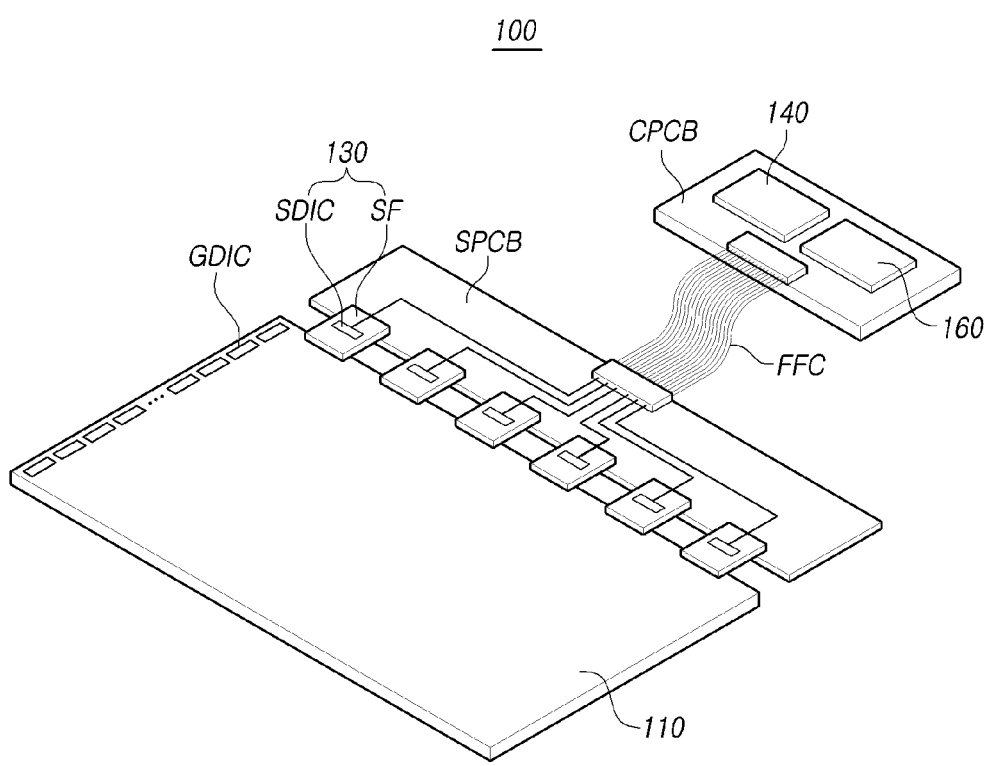
FIG. 2 illustrates a system diagram of the touch display device according to aspects of the present disclosure.

FIG. 2 illustrates a system diagram of the touch display device according to aspects of the present disclosure.

As an example, FIG. 2 illustrates that each of the source driving integrated circuits SDIC of the data driving circuit 130 in the touch display device 100 according to aspects of the present disclosure is implemented with a COF type among various structures (e.g., a TAB, a COG, and a COF), and the gate driving circuit 120 and the emission driving circuit are implemented with a GIP type among various structures such as a TAB, a COG, a COF, and a GIP.

When the gate driving circuit 120 is implemented in a GIP type, the plurality of gate driving integrated circuits GDIC of the gate driving circuit 120 may be directly formed in a bezel area of the display panel 110. At this time, the gate driving integrated circuits GDIC may receive various signals (e.g., clock signal, gate high signal, gate low signal, etc.) necessary for generating the scan signal through the signal lines related to gate driving operation arranged in the bezel area.

Likewise, the data driving circuit 130 may include one or more source driving integrated circuits SDIC, which may be mounted on a source film SF, respectively. One portion of the source film SF may be electrically connected to the display panel 110. In addition, electrical lines may be disposed on the source films SF to electrically connect the source driving integrated circuits SDIC and the display panel 110.

The touch display device 100 may include at least one source printed circuit board SPCB in order to connect the plurality of source driving integrated circuits SDIC to other devices by electrical circuit, and a control printed circuit board CPCB in order to mount various control components and electric elements.

The other portion of the source film SF, on which the source driving integrated circuit SDIC is mounted, may be connected to the at least one source printed circuit board SPCB. That is, one portion of source film SF, on which the source driving integrated circuit SDIC is mounted, may be electrically connected to the display panel 110, and the other portion of the source film SF may be electrically connected to the source printed circuit board SPCB.

The timing controller 140 and a power management circuit 160 may be mounted on the control printed circuit board CPCB. The timing controller 140 may control the operations of the data driving circuit 130 and the gate driving circuit 120. The power management circuit 160 may supply a driving voltage and a driving current, or control a voltage and a current for the display panel 110, the data driving circuit 130 and the gate driving circuit 120.

At least one source printed circuit board SPCB and the control printed circuit board CPCB may have circuitry connection by at least one connecting member. The connecting member may be, for example, a flexible printed circuit FPC, a flexible flat cable FFC, or the like. At least one source printed circuit board SPCB and the control printed circuit board CPCB may be integrated into a single printed circuit board.

The power management circuit 160 supplies the driving voltage, which is required for a display driving operation or a sensing operation of the characteristic value, to the source printed circuit board SPCB through the flexible printed circuit FPC or the flexible flat cable FFC. The driving voltage supplied to the source printed circuit board SPCB, is transmitted to emit or sense a specific subpixel SP in the display panel 110 via the source driving integrated circuits SDIC.

Each of the subpixels SP arranged in the touch display panel 110 of the display device 100 may include a light emitting element and circuit elements, such as a driving transistor to drive it.

The type and number of the circuit elements constituting each of the subpixels SP may be variously determined depending on the function, the design, or the like.

Figure 3:
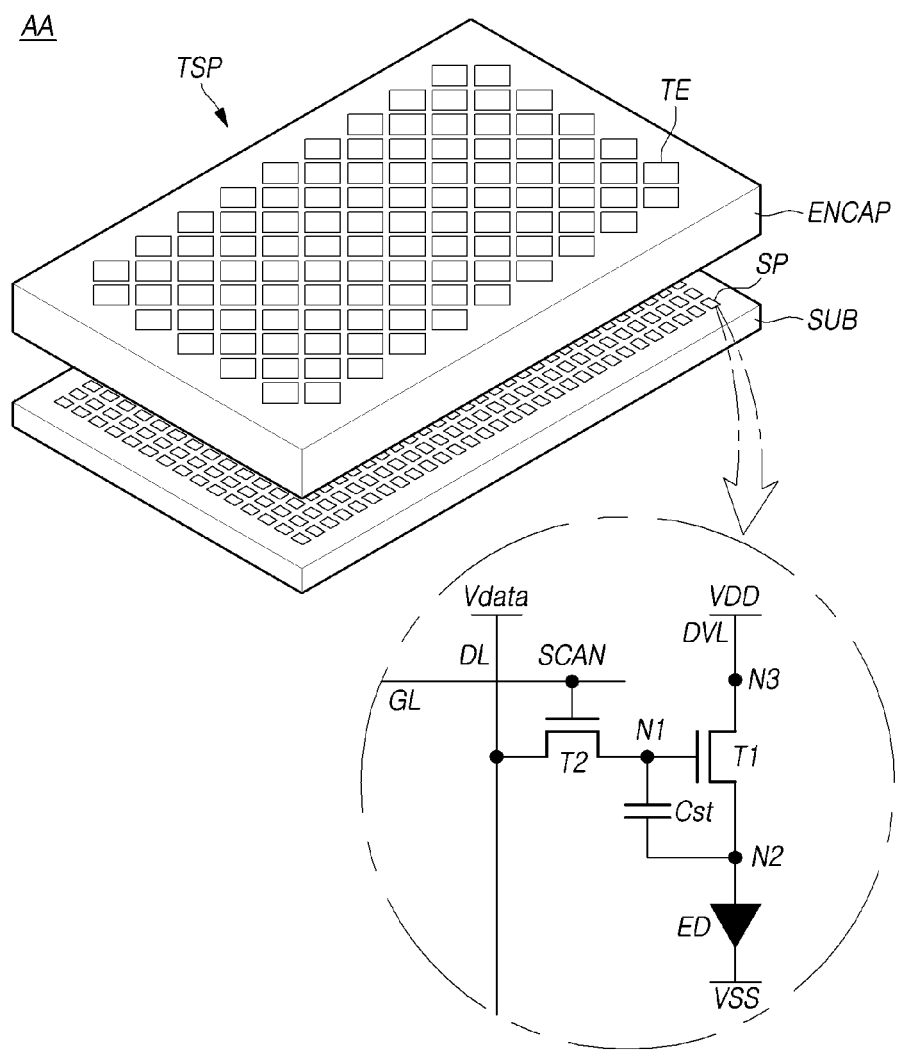
FIG. 3 illustrates a structure in which a touch screen panel is embedded in a display panel of a touch display device according to embodiments of the present disclosure.

FIG. 3 illustrates a structure in which a touch screen panel is embedded in a display panel of a touch display device according to embodiments of the present disclosure.

Referring to FIG. 3, a plurality of subpixels SP may be disposed on a substrate SUB in an active area AA of the display panel 110 in the touch display device 100 according to embodiments of the present disclosure.

Each subpixel SP may include a light emitting element ED, a first transistor T1 for driving the light emitting element ED, a second transistor T2 for transmitting a data voltage Vdata to a first node N1 of the first transistor T1, and a storage capacitor Cst for maintaining a constant voltage for one frame.

The first transistor T1 may include a first node N1 to which a data voltage Vdata may be supplied through the second transistor T2, a second node N2 electrically connected to the light emitting element ED, and a third node N3 to which a driving voltage VDD is supplied from a driving voltage line DVL. The first node N1 may be a gate node, the second node N2 may be a source node or a drain node, and the third node N3 may be a drain node or a source node. The first transistor T1 may also be referred to as a driving transistor for driving the light emitting element ED.

The light emitting element ED may include a first electrode (e.g., an anode electrode), a light emitting layer, and a second electrode (e.g., a cathode electrode). The first electrode may be electrically connected to the second node N2 of the first transistor T1, and the second electrode may be supplied with a base voltage VSS.

The light emitting layer of the light emitting element ED may be an organic light emitting layer containing an organic material. In this case, the light emitting element ED may be an organic light emitting diode.

The second transistor T2 may be controlled to be turned on and off by a scan signal SCAN supplied through a gate line GL, and may be electrically connected between the first node N1 of the first transistor T1 and the data line DL. The second transistor T2 may also be referred to as a switching transistor.

When the second transistor T2 is turned on by the scan signal SCAN, a data voltage Vdata supplied through the data line DL is transmitted to the first node N1 of the first transistor T1.

The storage capacitor Cst may be electrically connected between the first node N1 and the second node N2 of the first transistor T1.

Each subpixel SP may have a 2T1C structure including two transistors T1, T2 and one capacitor Cst, and may further include one or more transistors, or may further include one or more capacitors in some cases, and embodiments of the present disclosure is not limited thereto.

The storage capacitor Cst may be an external capacitor which is intentionally designed to be provided outside the first transistor T1, instead of a parasitic capacitor which is provided between the first node N1 and the second node N2 of the first transistor T1.

Each of the first transistor T1 and the second transistor T2 may be an n-type transistor or a p-type transistor.

On the other hand, circuit elements such as a light emitting element ED, two or more transistors T1, T2, and one or more capacitors Cst, may be disposed in the display panel 110. Since the circuit elements are vulnerable to external moisture or oxygen, an encapsulation layer ENCAP for preventing external moisture or oxygen from penetrating into the circuit elements may be disposed in the display panel 110.

The touch screen panel TSP may be embedded in the display panel 110 by being disposed on the encapsulation layer ENCAP in the touch display device 100 according to embodiments of the present disclosure. For example, a plurality of touch electrodes TE constituting the touch screen panel TSP may construct the display panel 110 by being disposed on the encapsulation layer ENCAP in the touch display device 100.

The touch display device 100 may sense a touch by a mutual-capacitance scheme or a self-capacitance scheme, as a touch sensing scheme based on capacitance.

In case of a touch sensing scheme based on mutual-capacitance, a plurality of touch electrodes TE may be classified as touch driving electrodes which is supplied touch driving signals through touch driving lines, and touch sensing electrodes which supplies touch sensing signals through touch sensing lines and forms capacitances with the touch driving electrodes. Here, the touch driving lines and the touch sensing lines may be referred to as touch lines. Also, the touch driving signals and the touch sensing signals may be referred to as touch signals.

In case of the touch sensing scheme based on mutual-capacitance, the touch presence and the touch coordinate may be detected based on a change of mutual-capacitance formed between the touch driving electrode and the touch sensing electrode according to a presence of a pointer such as a finger, a pen, or the like.

In case of the touch sensing scheme based on self-capacitance, each touch electrode serves as both the touch driving electrode and the touch sensing electrode. That is, a touch driving signal is supplied to a touch electrode TE through a touch line, and a touch sensing signal generated in the touch electrode, to which the touch driving signal is supplied, is transmitted through the same touch line. Accordingly, in case of the touch sensing scheme based on self-capacitance, there is no distinction between the touch driving electrode and the touch sensing electrode and no distinction between the touch driving line and the touch sensing line.

In case of the touch sensing scheme based on self-capacitance, the touch presence and a touch coordinate may be detected based on a change in capacitance formed between a pointer such as a finger, a pen, or the like, and a touch electrode TE.

Thus, the touch display device 100 may sense a touch by the touch sensing scheme based on mutual-capacitance or the touch sensing scheme based on self-capacitance.

In this case, the display panel 110 may be a split type in which a plurality of touch electrodes TE is separated from each other, or a woven type in which touch electrodes TE of different sizes are disposed in adjacent rows (or columns).

Figure 4:
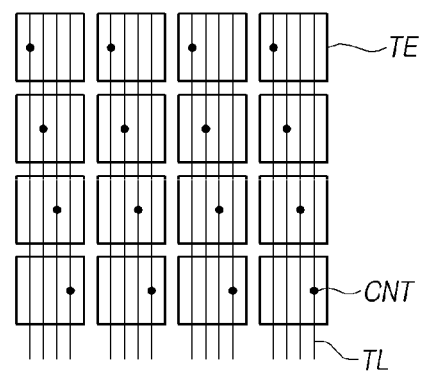
FIG. 4 illustrates a display panel comprised of split type touch electrodes in a touch display device according to embodiments of the present disclosure.

FIG. 4 illustrates a display panel comprised of split type touch electrodes in a touch display device according to embodiments of the present disclosure.

Referring to FIG. 4, when a plurality of split type touch electrodes TE are disposed in the display panel 110 of the touch display device 100 according to embodiments of the present disclosure, each of a plurality of touch electrodes TE may be electrically connected with touch lines TL through one or more contact holes CNT.

The plurality of touch electrodes TE may be positioned in an active area. Depending on cases, some (e.g., outermost touch electrodes) of the plurality of touch electrodes TE may be positioned in an outside area (bezel area) of the active area or may extend to the outside area (bezel area) of the active area. The active area may be an area in which images are displayed or touch sensing process is performed.

A plurality of touch lines TL electrically connected to the plurality of touch electrodes TE may be positioned in an active area. Depending on cases, all or some of the plurality of touch lines TL may be positioned at outside area of the active area. When the plurality of touch lines TL electrically connected to the plurality of touch electrodes TE are positioned in the active area, the plurality of touch lines TL may be overlapped the plurality of touch electrodes TE by positioning in a layer different from the plurality of touch electrodes TE.

The plurality of touch lines TL all may have the same or similar length and may be disposed from a point connected with the touch driving circuit 150 to the opposite point. The plurality of touch lines TL may be different only in the position (i.e., the position of the contact hole CNT) where they are respectively connected with the corresponding touch electrodes TE.

In a case of a split type display panel 110, if one touch electrode TE is electrically connected with one touch line TL, there should be a plurality of touch lines TL as many as the number of a plurality of touch electrodes TE. The number of the plurality of touch lines TL may correspond to the number of touch channels for signal input and output of the touch driving circuit 150.

Accordingly, in case of a split type display panel 110 composed of 4×4 touch electrodes TE in which 16 touch electrodes TE are arranged in four rows and four columns, 16 touch lines TL and 16 touch channels may exist.

The touch display device 100 of the present disclosure may be formed not only a split type in which a plurality of touch electrodes TE are separated from each other, but also a woven type in which touch electrodes TE of different sizes are disposed in adjacent rows or columns.

Figure 5:
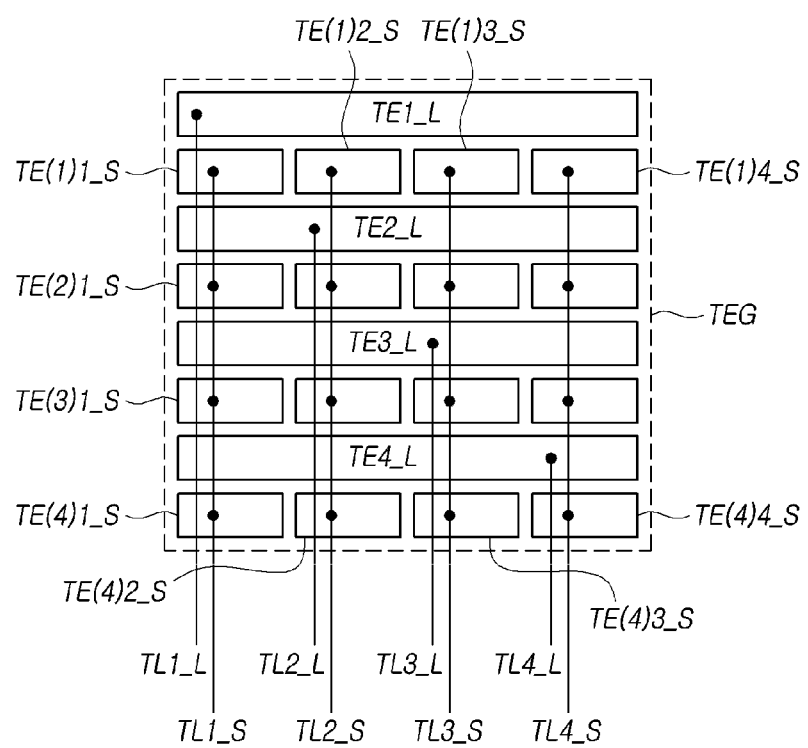
FIG. 5 illustrates a display panel with woven type touch electrodes in a touch display device according to embodiments of the present disclosure.

FIG. 5 illustrates a display panel with woven type touch electrodes in a touch display device according to embodiments of the present disclosure.

Referring to FIG. 5, the woven type display panel 110 of the touch display device 100 according to embodiments of the present disclosure may include a plurality of touch electrode groups TEG comprising of four long touch electrodes TE1_L-TE4_L and four short touch electrodes TE1_S-TE4_S connected by the same line.

In other words, each long touch electrodes TE1_L, TE2_L, TE3_L, TE4_L with long lengths in the row direction may correspond to a length of four short touch electrodes TE(1)1_S, TE(1)2_S, TE(1)3_S, TE(1)4_S. In this case, the four short touch electrodes (e.g., TE(1)1_S, TE(2)1_S, TE(3)1_S, TE(4)1_S) in a column direction may be connected to one short touch line (e.g., TL1_S). Therefore, four short touch electrodes arranged in the column direction may constitute one short touch electrode block connected by a same line. Also, four long touch electrodes and four short touch electrode blocks connected by the same line corresponding to them may constitute one touch electrode group TEG.

In the case of the woven type 4×4 touch electrode structure, a number of the short touch electrodes in a row where the short touch electrodes are arranged among two adjacent rows is ¼ of the number of long touch electrodes in a row where the long touch electrodes are arranged. Accordingly, each length of the long touch electrodes TE1_L, TE2_L, TE3_L, TE4_L is approximately four times the length of the short touch electrodes TE1_S-TE4_S.

In this case, the woven type 4×4 touch electrode structure consists of four long touch electrodes TE1_L, TE2_L, TE3_L, TE4_L and sixteen short touch electrodes TE(1)1_S, TE(1)2_S, TE(1)3_S, TE(1)4_S~TE(4)1_S, TE(4)2_S, TE(4)3_S, TE(4)4_S, but four short touch electrodes (e.g., TE(1)1_S, TE(2)1_S, TE(3)1_S, TE(4)1_S) in a column direction are connected to one short touch line (e.g., TL1_S).

Therefore, four short touch electrodes (e.g., TE(1)1_S, TE(2)1_S, TE(3)1_S, TE(4)1_S) connected to the short touch line (e.g., TL1_S) constitutes one short touch electrode block connected by same line, and sixteen short touch electrodes TE(1)1_S, TE(1)2_S, TE(1)3_S, TE(1)4_S~TE(4)1_S, TE(4)2_S, TE(4)3_S, TE(4)4_S constitute four short touch electrode blocks connected respectively by the same line.

As a result, each long touch line TL1_L, TL2_L, TL3_L, TL4L is connected to four long touch electrodes TE1_L, TE2_L, TE3_L, TE4_L respectively, and each of four short touch electrode blocks connected by same line is connected to the short touch lines TL1_S, TL2_S, TL3_S, TL4_S respectively. Therefore, in the case of a woven type 4×4 touch electrode structure, eight touch lines TL1_L, TL2_L, TL3_L, TL4L, TL1_S, TL2_S, TL3_S, TL4_S and eight touch channels are required.

Accordingly, comparing to the split type touch electrode structure, the woven type touch electrode structure has an effect of reducing the number of touch lines and touch channels.

On the other hand, the size of the touch electrode group TEG may be variously changed, but the size of the touch electrode group TEG may be determined in consideration of a distance between a finger or a stylus for detecting for multi-touch in order to efficiently arrange the touch electrodes TE on the display panel 110 and increase the accuracy of detection for multi-touch.

On the other hand, a plurality of a woven type touch electrode groups TEG may be disposed in a horizontal direction and a vertical direction in the display panel 110. In this case, each touch electrode group TEG is electrically separated in an active area in which an image is displayed in the display panel 110, but it may be connected to the touch driving circuit 150 through a touch line TL in a non-active area in which an image is not displayed in the display panel 110.

Figure 6:
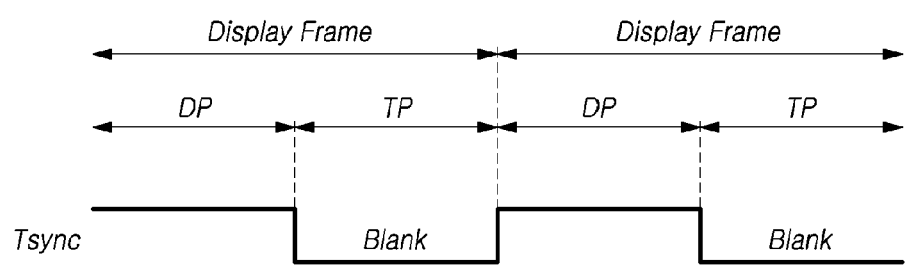
FIG. 6 illustrates timings for configuring a display driving period and a touch driving period in the touch display device according to embodiments of the present disclosure.

FIG. 6 illustrates timings for configuring a display driving period and a touch driving period in the touch display device according to embodiments of the present disclosure.

Referring to FIG. 6, touch display device 100 according to embodiments of the present disclosure performs display driving for displaying images during the predefined display driving period DP, and performs touch driving for sensing a touch input from a finger or a stylus during the predefined touch driving period TP within a display frame period.

The touch display device 100 uses a common electrode for driving each pixel as an electrode for sensing a touch. Accordingly, a common voltage is provided to thin film transistor connected to the common electrode during the display driving period DP, and a touch driving signal is provided to the common electrode acting as a touch electrode during the touch driving period TP.

The display driving period DP and the touch driving period TP may be equal in time, all or partly overlap with each other in time, or be separated from each other in time.

A driving method in which the display driving period DP and the touch driving period TP be separated from each other in time may be referred to as time division driving.

When the display driving period DP and the touch driving period TP are equal in time, the display driving operation and the touch driving operation may be performed simultaneously. This driving method is may be referred to as time free driving operation.

In the time division driving, the display driving period DP and the touch driving period TP may be alternately arranged.

Thus, when the display driving period DP and the touch driving period TP are separated in time while alternately being arranged, the touch driving period TP may correspond to a blank period Blank in which the display driving operation is not performed.

The touch display device 100 may generate a touch synchronization signal Tsync swing between a high level and a low level, and through this, may identify or control the display driving period DP and the touch driving period TP. That is, the touch synchronization signal Tsync may be a driving timing control signal for defining the touch driving period TP.

For example, a high level period (or a low level period) of the touch synchronization signal Tsync may be corresponded to the display driving period DP, and the low level period (or the high level period) of the touch synchronization signal Tsync may be corresponded to the touch driving period TP.

In this case, the touch driving circuit 150 may supply the touch driving signal to the touch electrode TE in the touch driving period TP where the touch synchronization is at the low level, and may sense the touch presence and touch position of the passive stylus or the active stylus using a touch sensing signal received from the touch electrode TE.

Meanwhile, with respect to methods of assigning the display driving period DP and the touch driving period TP in one display frame period, for example, one display frame period may be divided into one display driving period DP and one touch driving period TP, and display driving operation may be performed during one display driving period DP, and touch driving operation for sensing a touch input from a finger and a stylus may be performed during one touch driving period TP corresponding to a blank period.

The touch display device 100 performs the touch driving operation once during a screen refresh rate or a display frame period corresponding to one period of a frame frequency.

For example, when the frame frequency is 60 Hz, display driving operation is performed to turn on or turn off sub-pixels SP through N gate lines GL constituting the display panel 110 within a period of 1/60 second (16.7 ms). After that, a touch driving period TP for touch sensing operation is performed for a predetermined interval. In this case, the touch report rate will be 60 Hz.

As described above, a touch driving mode that a display driving operation is performed during one display driving period DP within one display frame period and a touch driving operation is performed during one touch driving period TP corresponding to a blank period, may be referred to as "VB driving mode." In this VB driving mode, the display driving period DP may correspond to 80% of 1/60 second (16.7 ms), and the touch driving period TP may be 20% of 1/60 second (16.7 ms).

In another example, one display frame period may be divided into two or more display driving periods DP and two or more touch driving periods TP, and display driving operation may be performed during two or more display driving periods DP in one display frame period, and touch driving operation for sensing once or two or more times a touch input from a finger and a stylus on all or at least a part of a display screen may be performed during two or more touch driving periods TP in one display frame period.

Like this, when dividing one display frame period into two or more display driving periods DP and two or more touch driving periods TP, and then performing the display driving operation and the touch driving operation, each of two or more blank periods corresponding to two or more touch driving periods TP in one display frame period is sometimes referred to as a long horizontal blank ("LHB").

Accordingly, two or more periods in which the sensing of a touch from a stylus or a finger is performed in a display frame period may be referred to as LHB s or touch driving periods TP, and touch driving operation performed during two or more LHBs in one touch frame period is referred to as "LHB driving operation." In the case of the LHB driving mode, the display driving period DP and the touch driving period TP may correspond to 50% of 1/60 second (16.7 ms), respectively.

Figure 7:
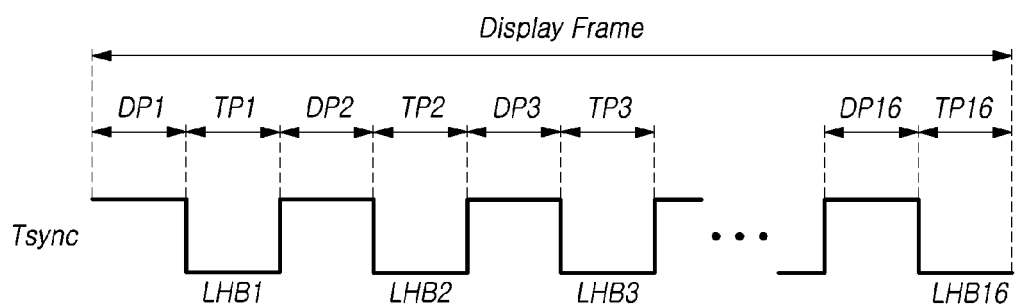
FIG. 7 illustrates a timing signal of a LHB driving operation in a touch display device according to embodiments of the present disclosure.

FIG. 7 illustrates a timing signal of a LHB driving operation in a touch display device according to embodiments of the present disclosure.

Referring to FIG. 7, in the touch display device 100 according to embodiments of the present disclosure, one display frame period may be time divided into 16 display driving periods DP1-DP16 and 16 touch driving periods TP1-TP16.

In this case, the 16 touch driving periods TP1-TP16 may correspond to 16 long horizontal blanks LHB 1-LHB 16.

In this case, the touch display device 100 divides one display frame period into one or more display driving periods DP1-DP16 and one or more touch driving periods TP1-TP16, and performs alternately the display driving operation and the touch driving operation.

Alternatively, the touch driving periods TP1-TP16 may proceed independently from the display driving periods DP1-DP16.

The VB driving mode may be mainly used for the touch display device 100 with relatively low touch sensitivity and high resolution since the display driving period DP has a high proportion of 80% within one display frame period. On the other hand, the LHB driving mode may be mainly used for the touch display device 100 with high touch sensitivity since a plurality of touch driving periods TP are included in one display frame period.

However, since the driving mode of the touch display device 100 cannot be changed after it is determined at the time of shipment or design, it is difficult to change the touch display device 100 according to the purpose or use it for various purposes.

The touch display device 100 of the present disclosure may switch touch driving modes by controlling the gate driving circuit 120 using a touch control signal to control the touch driving period TP and the display driving period DP.

Figure 8:
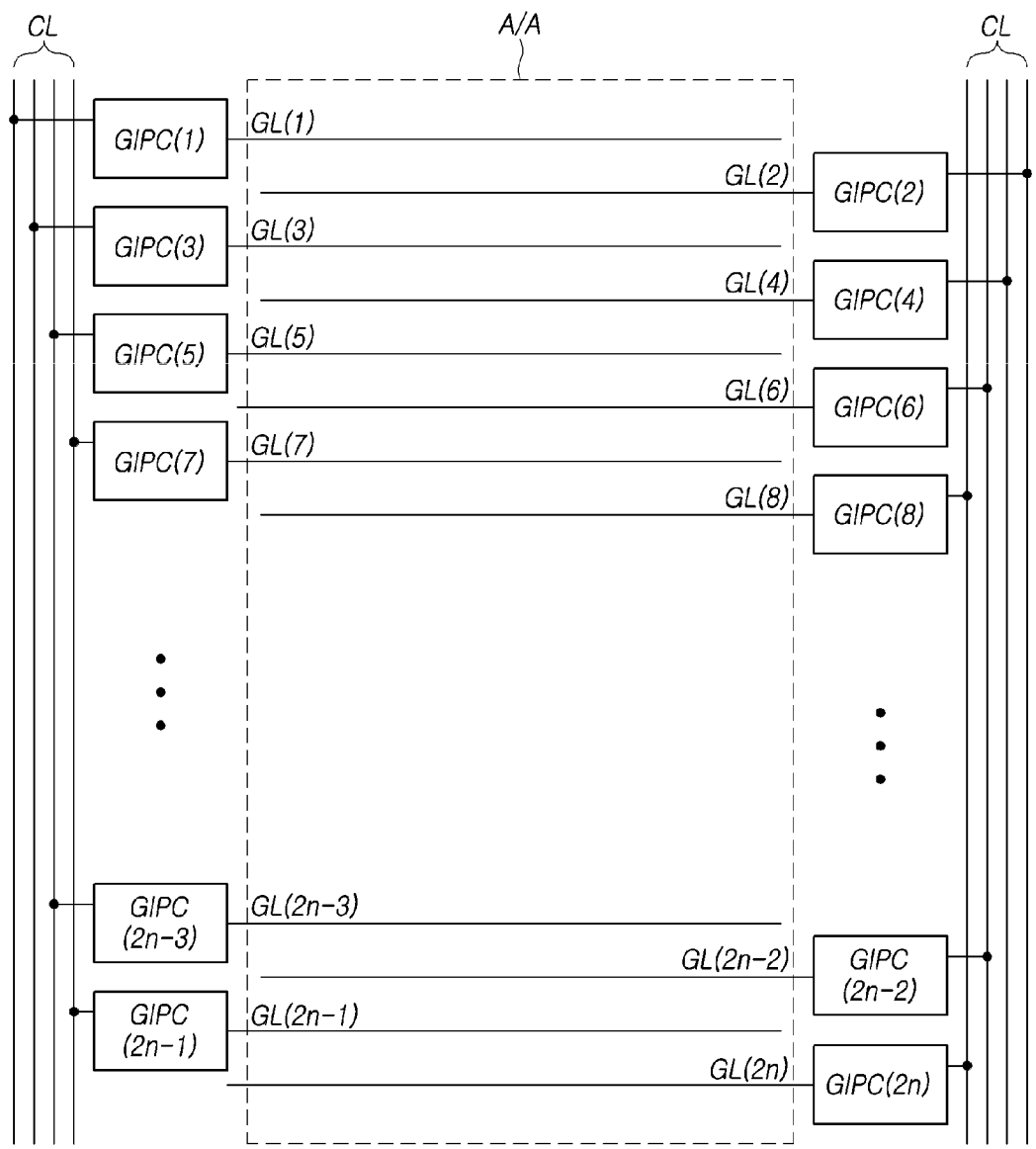
FIG. 8 illustrates a diagram of a display panel in which a gate driving circuit is implemented in a GIP type in the touch display device according to embodiments of the present disclosure.

FIG. 8 illustrates a diagram of a display panel in which a gate driving circuit is implemented in a GIP type in the touch display device according to embodiments of the present disclosure.

Referring to FIG. 8, the touch display device 100 according to embodiments of the present disclosure may include 2n gate lines GL1-GL(2n) (n is a natural number) in a display area A/A for displaying an image on the display panel 110.

In this case, the gate driving circuit 120 may be disposed in a non-display area corresponding to the outside of the display area A/A of the display panel 110, and may include 2n GIP circuits GIPC matched to the 2n gate lines GL(1)-GL(2n) with each other.

Accordingly, the 2n GIP circuits GIPC may supply the scan signals SCAN to the 2n gate lines GL(1)-GL(2n).

As described above, when the gate driving circuit 120 is implemented in a GIP type, there is no need to manufacture a separate integrated circuit having a gate driving function and bond it to the display panel 110. As a result, it is possible to reduce the number of integrated circuits and omit the connecting process of the integrated circuit to the display panel 110. In addition, the size of the bezel area for bonding the integrated circuit in the display panel 110 may be reduced.

It may describe the 2n GIP circuits GIPC as GIP(1), GIP(2), . . . , GIP(2n) in order to distinguish the 2n GIP circuits GIPC from each other and to identify a relation with the 2n gate lines GL(1)-GL(2n).

Here, it illustrates a case where 2n GIP circuits GIPC(1)-GIPC(2n) are divided and arranged on both sides of the display area A/A. For example, odd-numbered GIP circuits GIPC(1), GIPC(3), . . . , GIPC(2n-1) among the 2n GIP circuits GIPC(1)-GIPC(2n) may drive odd-numbered gate lines GL(1), GL(3), GL(2n-1). Also, even-numbered GIP circuits GIPC(2), GIPC(4), . . . , GIPC(2n) may drive even-numbered gate lines GL(2), GL(4), GL(2n).

Alternatively, the 2n GIP circuits GIPC(1)-GIPC(2n) may be disposed only on one side of the display area A/A.

A plurality of clock signal line CL in order to supply gate clocks required for generating and supplying the scan signal SCAN to the gate driving circuit 120 may be disposed in the non-display area corresponding to the outside of the display area A/A of the display panel 110.

Figure 9:
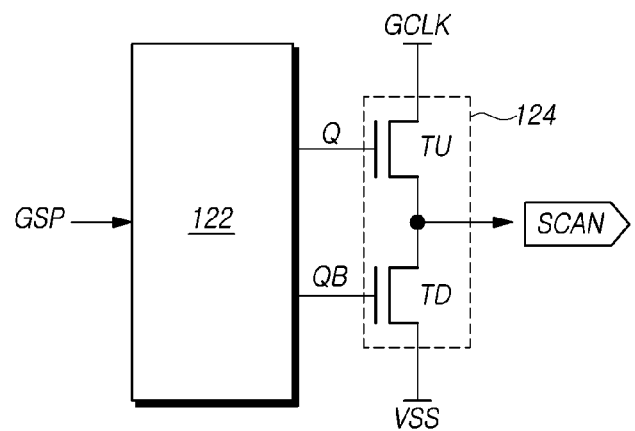
FIG. 9 illustrates a schematic diagram of a GIP circuit in the touch display device according to embodiments of the present disclosure.

FIG. 9 illustrates a schematic diagram of a GIP circuit in the touch display device according to embodiments of the present disclosure.

Referring to FIG. 9, a GIP circuit GIPC may include a shift register 122 and a buffer circuit 124 in the touch display device 100 according to embodiments of the present disclosure.

The GIP circuit GIPC operates according to the gate start pulse GSP and generates the scan signals SCAN according to the gate clock GCLK. The scan signals SCAN generated from the GIP circuit GIPC are sequentially shifted and sequentially supplied through the gate lines GL.

The buffer circuit 124 may have two nodes Q, QB that are important for a gate driving state, and may include a pull-up transistor TU and a pull-down transistor TD. Here, a gate node of the pull-up transistor TU may correspond to the Q node, and a gate node of the pull-down transistor TD may correspond to the QB node.

The shift register 122 may be referred to as a shift logic circuit, and may be used to generate the scan signal SCAN in synchronization with the gate clock GCLK.

The shift register 122 may include a plurality of transistors and control the Q node and the QB node connected to the buffer circuit 124 so that the buffer circuit 124 may generate the scan signal SCAN.

The scan signals SCAN may be generated by sequentially turning on the output of the shift register 122 according to the gate clock GCLK. That is, a logic state for determining on/off of the gate line GL may be sequentially supplied to the buffer circuit 124 by controlling the output time of the shift register 122 using the gate clock GCLK.

Each voltage state of the Q node and the QB node of the buffer circuit 124 may be changed by the shift register 122. Accordingly, the buffer circuit 124 may supply a voltage (e.g., the voltage may have a high level voltage or a low level voltage, for example, a clock signal with a gate high level voltage VGH) for turning on the corresponding gate line GL, or may supply a voltage (e.g., the voltage may have a low level voltage or a high level voltage, for example, a base voltage VSS with a gate low level voltage VGL) for turning off the corresponding gate line GL.

Meanwhile, a GIP circuit GIPC may further include a level shifter in addition to the shift register 122 and the buffer circuit 124.

In this case, the shift register 122 and the buffer circuit 124 constituting the GIP circuit GIPC may be connected in various structures.

Figure 10:
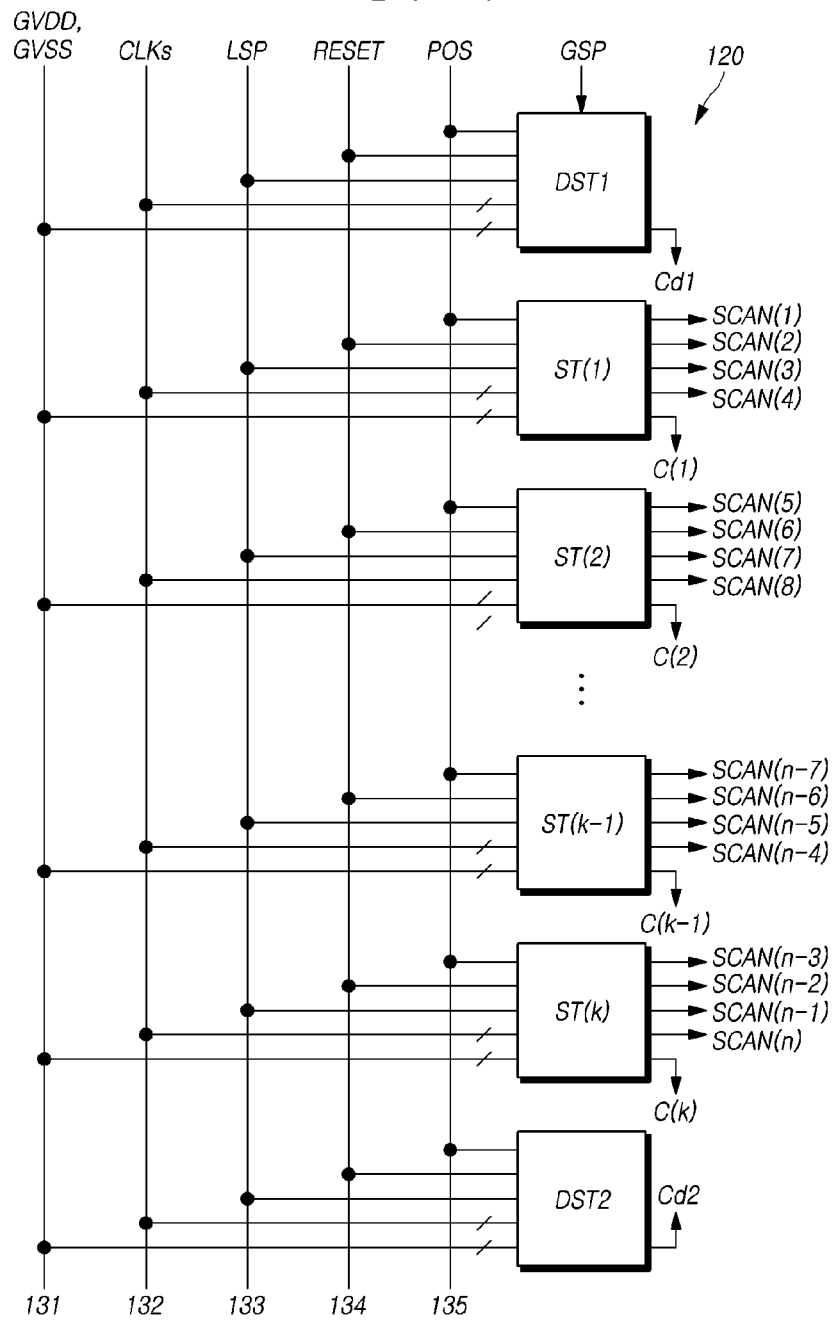
FIG. 10 illustrates a configuration of a plurality of stage circuits constituting a gate driving circuit according to embodiments of the present disclosure.

FIG. 10 illustrates a configuration of a plurality of stage circuits constituting a gate driving circuit according to embodiments of the present disclosure.

Referring to FIG. 10, the gate driving circuit 120 according to embodiments of the present disclosure may include first to kth stage circuits ST(1)-ST(k) (k is a positive integer), a gate driving voltage line 131, a clock signal line 132, a line sensing preparation signal line 133, a reset signal line 134, and a panel-on signal line 135.

In addition, the gate driving circuit 120 may further include a previous dummy stage circuit DST1 disposed at a front end of the first stage circuit ST(1) and a rear dummy stage circuit DST 2 disposed at a rear end of the kth stage circuit ST(k).

The gate driving voltage line 131 supplies a high potential gate voltage GVDD and a low potential gate voltage GVSS which are transmitted from the power management circuit 160 to the first to kth stage circuits ST(1)-ST(k), the previous dummy stage circuit DST1 and the rear dummy stage circuit DST2 respectively.

The gate driving voltage line 131 may include a plurality of high potential gate voltage lines supplying a plurality of high potential gate voltages GVDD with different voltage levels and a plurality of low potential gate voltage lines supplying a plurality of low potential gate voltages GVSS with different voltage levels.

For example, the gate driving voltage line 131 may include three high potential gate voltage lines supplying a first high potential gate voltage GVDD1, a second high potential gate voltage GVDD2, and a third high potential gate voltage GVDD3 with different voltage levels to each other and three low potential gate voltage lines supplying a first low potential gate voltage GVSS1, a second low potential gate voltage GVSS2, and a third low potential gate voltage GVSS3 with different voltage levels to each other. However, this is only an example, and the number of lines included in the gate driving voltage line 131 may vary depending on the embodiments.

The clock signal line 132 supplies a plurality of clock signals CLKs, for example, a carry clock signal or a scan clock signal, transmitted from the timing controller 140 to the first to kth stage circuits ST(1)-ST(k), the previous dummy stage circuit DST1 and the rear dummy stage circuit DST2 respectively.

The line sensing preparation signal line 133 may supply a line sensing preparation signals LSP transmitted from the timing controller 140 to the first to kth stage circuits ST(1)-

ST(k). Optionally, the line sensing preparation signal line 133 may be further connected to the previous dummy stage circuit DST1.

The reset signal line 134 may supply a reset signal RESET transmitted from the timing controller 140 to the first to kth stage circuits ST(1)-ST(k), the previous dummy stage circuit DST1, and the rear dummy stage circuit DST2.

The panel-on signal line 135 may supply a panel-on signal POS transmitted from the timing controller 140 to the first to kth stage circuits ST(1)-ST(k), the previous dummy stage circuit DST1 and the rear dummy stage circuit DST2, respectively.

In addition, lines for supplying other signals in addition to the above lines 131, 132, 133, 134, 135 may be additionally connected to the first to kth stage circuits ST(1)-ST(k), the previous dummy stage circuit DST1 and the rear dummy stage circuit DST2. For example, a line for supplying a gate start pulse GSP to the previous dummy stage circuit DST1 may be additionally connected to the previous dummy stage circuit DST1.

The previous dummy stage circuit DST1 may generate a first dummy carry signal Cd1 in response to the gate start pulse GSP transmitted from the timing controller 140.

The first dummy carry signal Cd1 may be supplied to any one of the first to kth stage circuits ST(1)-ST(k).

The rear dummy stage circuit DST2 may generate a second dummy carry signal Cd2. The second dummy carry signal Cd2 may be supplied to any one of the first to kth stage circuits ST(1)-ST(k).

The first to kth stage circuits ST(1)-ST(k) may be connected to each other in a stepped or cascaded manner.

The first to kth stage circuits ST(1)-ST(k) may generate j (j is a positive integer) scan signals SCAN and one carry signal C, respectively. That is, the arbitrary stage circuit may generate the first to jth scan signals and one carry signal C.

For example, each stage circuit may generate four scan signals SCAN and one carry signal C. For example, the first stage circuit ST(1) generates a first scan signal SCAN(1), a second scan signal SCAN(2), a third scan signal SCAN(3), a fourth scan signal SCAN(4) and a first carry signal C(1). Also, the second stage circuit ST(2) generates a fifth scan signal SCAN(5), a sixth scan signal SCAN(6), a seventh scan signal SCAN(7), an eighth scan signal SCAN(8) and a second carry signal C(2). Thus, j is 4 in this example.

The number of scan signals generated from the first to kth stage circuits ST(1)-ST(k) coincides with a number n of the gate lines 15 disposed on the display panel 10. As described above, each stage circuit generates j scan signals. Therefore, the relation of j*k=n is established.

For example, when j=4, the number k of the stage circuits is ¼ of the number n of the gate lines GL. However, the number of scan signals generated from each stage circuit is not limited thereto. That is, each stage circuit in the embodiments of the present disclosure may generate one, two, or three scan signals, or may generate five or more scan signals. The number of stage circuits may vary according to the number of scan signals generated from each stage circuit.

The scan signal SCAN generated from the first to kth stage circuits ST(1)-ST(k) may be a signal for sensing the threshold voltage of the driving transistor DRT, or may be a signal for displaying an image. Also, the carry signals C generated from the first to kth stage circuits ST(1)-ST(k) may be supplied to different stage circuits, respectively.

Figure 11:
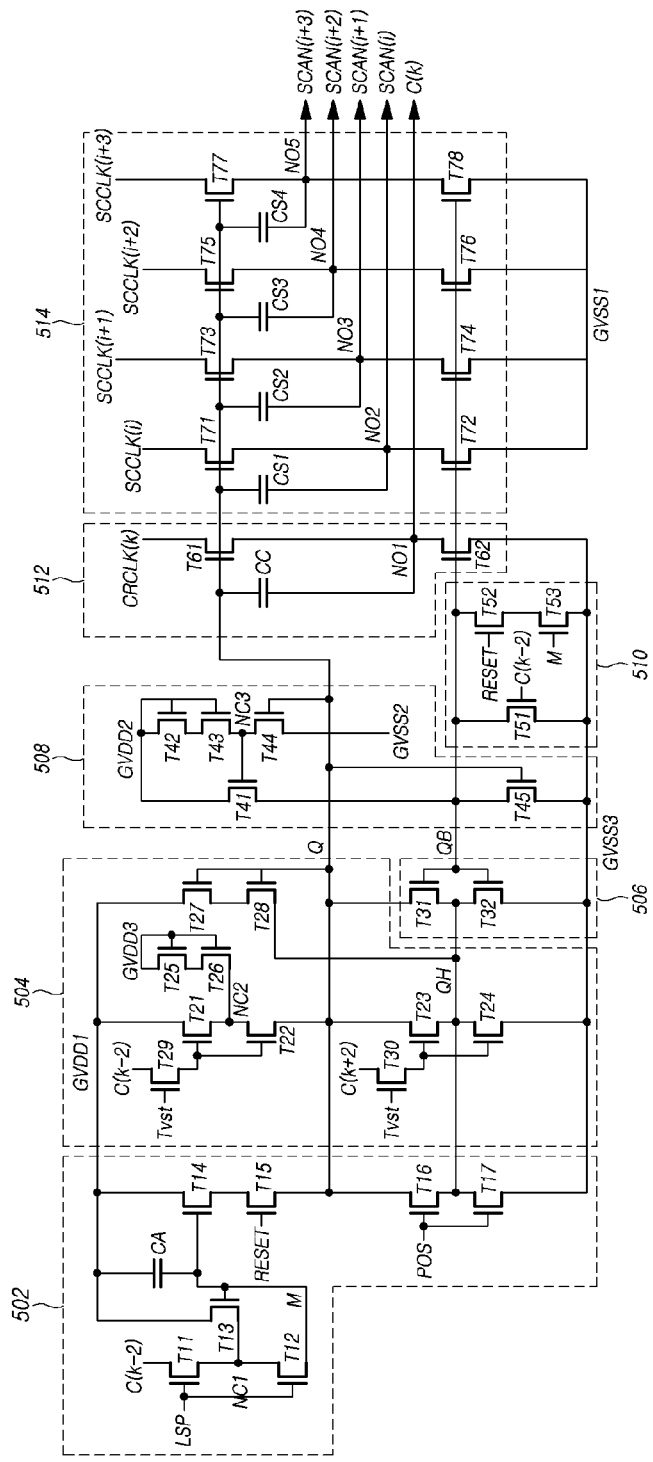
FIG. 11 illustrates a gate driving integrated circuit constituting a gate driving circuit in a display driving circuit according to embodiments of the present disclosure.

FIG. 11 illustrates a gate driving integrated circuit constituting a gate driving circuit in a display driving circuit according to embodiments of the present disclosure.

Referring to FIG. 11, a gate driving integrated circuit GDIC according to embodiments of the present disclosure may include an M node, a Q node, and a QB node, and include a line selecting unit 502, a Q node controlling unit 504, a Q node stabilizing unit 506, an inverting unit 508, a QB node stabilizing unit 510, a carry signal generating unit 512, and a scan signal generating unit 514. Each structure referred to herein as a unit, such as the line selecting unit 502, may be comprised of circuits and electronic structures. Thus, each of the line selecting unit 502, the Q node controlling unit 504, the Q node stabilizing unit 506, the inverting unit 508, the QB node stabilizing unit 510, the carry signal generating unit 512, and the scan signal generating unit 514 are comprised of circuits.

The line selecting unit 502 charges the M node based on the previous carry signal C(k−2) in response to the line sensing preparation signal LSP. In addition, the line selecting unit 502 charges the Q node to the level of the first high potential gate voltage GVDD1 based on the charging voltage of the M node in response to the reset signal RESET. Also, the line selecting unit 502 discharges or resets the Q node to the level of the third low potential gate voltage GVSS3 in response to the panel-on signal POS. The panel on signal POS may use a gate start pulse GSP.

The line selecting unit 502 includes first to seventh transistors T11-T17 and a pre-charging capacitor CA.

The first transistor T11 and the second transistor T12 are connected between the first high potential gate voltage line transmitting the first high potential gate voltage GVDD1 and the M node. Also, the first transistor T11 and the second transistor T12 are connected in series with each other.

The first transistor T11 supplies the previous carry signal C(k−2) to a first connection node NC1 in response to the line sensing preparation signal LSP.

The second transistor T12 electrically connects the first connection node NC1 to the M node in response to the line sensing preparation signal LSP. For example, when the line sensing preparation signal LSP with high voltage is supplied to the first transistor T11 and the second transistor T12, the first transistor T11 and the second transistor T12 are simultaneously turned on so that the M node is charged to a level of the first high potential gate voltage GVDD1.

The third transistor T13 is turned on when the voltage level of the M node is at a high level to supply the first high potential gate voltage GVDD1 to the first connection node NC1. When the first high potential gate voltage GVDD1 is supplied to the first connection node NC1, a voltage difference between the gate voltage of the first transistor T11 and the first connection node NC1 increases.

Therefore, when the third transistor T13 is turned off by the line sensing preparation signal LSP with a low level supplied to the gate node of the first transistor T11, the first transistor T11 may be completely maintained in a turn-off state due to the voltage difference between the gate node of the first transistor T11 and the first connection node NC1. Accordingly, current leakage of the first transistor T11 and the voltage drop of the M node may be prevented, so that the voltage of the M node may be stably maintained.

The pre-charging capacitor CA is connected between the first high potential gate voltage line transmitting the first high potential gate voltage GVDD1 and the M node to store the difference between the first high potential gate voltage GVDD1 and a voltage charged at the M node.

When the first transistor T11, the second transistor T12, and the third transistor T13 are turned on, the pre-charging capacitor CA stores the high voltage of the previous carry signal C(k−2). When the first transistor T11, the second transistor T12, and the third transistor T13 are turned off, the pre-charging capacitor CA maintains the voltage of the M node with the stored voltage for a predetermined time.

The fourth transistor T14 and the fifth transistor T15 are connected between the first high potential gate voltage line transmitting the first high potential gate voltage GVDD1 and the Q node. The fourth transistor T14 and the fifth transistor T15 are connected in series with each other.

The fourth transistor T14 and the fifth transistor T15 charge the Q node to the first high potential gate voltage GVDD1 in response to the M node voltage and the reset signal RESET.

The fourth transistor T14 is turned on when the voltage of the M node is at a high level to supply the first high potential gate voltage GVDD1 to a common node of the fourth transistor T14 and the fifth transistor T15.

The fifth transistor T15 is turned on by the reset signal RESET with a high level to supply the voltage of the common node to the Q node. Accordingly, when the fourth transistor T14 and the fifth transistor T15 are simultaneously turned on, the Q node is charged to the first high potential gate voltage GVDD1.

The sixth transistor T16 and the seventh transistor T17 are connected between the Q node and a third low potential gate voltage line transmitting the third low potential gate voltage GVSS3. The sixth transistor T16 and the seventh transistor T17 are connected in series with each other.

The sixth transistor T16 and the seventh transistor T17 discharge the Q node to the third low potential gate voltage GVSS3 in response to the panel-on signal POS. The discharge of the Q node to the third low potential gate voltage GVSS3 may also be expressed as a reset of the Q node.

The seventh transistor T17 is turned on by the panel-on signal POS with a high level to supply the third low potential gate voltage GVSS3 to the QH node.

The sixth transistor T16 is turned on by the panel-on signal POS with a high level to electrically connect the Q node and the QH node. Therefore, when the sixth transistor T16 and the seventh transistor T17 are simultaneously turned on, the Q node is discharged or reset to the third low potential gate voltage GVSS3.

The Q node controlling unit 504 charges the Q node to the level of the first high potential gate voltage GVDD1 in response to the previous carry signal C(k−2), and discharges the Q node to the level of the third low potential gate voltage GVSS3 in response to the rear carry signal C(k+2).

The Q node controlling unit 504 includes first to tenth transistors T21-T30.

The first transistor T21 and the second transistor T22 are connected between the first high potential gate voltage line transmitting the first high potential gate voltage GVDD1 and the Q node. The first transistor T21 and the second transistor T22 are connected in series with each other.

In the ninth transistor T29, the touch control signal Tvst is supplied to a gate node, the previous carry signal C(k−2) is supplied to a drain node, and a source node is connected to gate nodes of the first transistor T21 and the second transistor T22 together. Accordingly, the ninth transistor T29 is turned on by the touch control signal Tvst. Also, the first transistor T21 and the second transistor T22 charges the Q node to a level of the first high potential gate voltage GVDD1 in response to the previous carry signal C(k−2) which is transmitted while the ninth transistor T29 is turned on.

The first transistor T21 is turned on by the previous carry signal C(k−2) to supply the first high potential gate voltage GVDD1 to the second connection node NC2.

The second transistor T22 is turned on by the previous carry signal C(k−2) to electrically connect the second connection node NC2 and the Q node. Accordingly, when the first transistor T21 and the second transistor T22 are simultaneously turned on, the first high potential gate voltage GVDD1 is supplied to the Q node.

The fifth transistor T25 and the sixth transistor T26 are connected to a third high potential gate voltage line transmitting the third high potential gate voltage GVDD3. The fifth transistor T25 and the sixth transistor T26 are connected in series to supply the third high potential gate voltage GVDD3 to the second connection node NC2 in response to the third high potential gate voltage GVDD3.

The fifth transistor T25 and the sixth transistor T26 are simultaneously turned on by the third high potential gate voltage GVDD3 to supply constantly a third high potential gate voltage GVDD3 to the second connection node NC2. Thus, the voltage difference between the gate voltage of the first transistor T21 and the second connection node NC2 is increased. Accordingly, when the first transistor T21 is turned off by the previous carry signal C(k−2) with a low level supplied to the gate node of the first transistor T21, the first transistor T21 may be completely maintained in a turn-off state due to a voltage difference between the gate node of the first transistor T21 and the second connection node NC2.

Accordingly, the current leakage of the first transistor T21 and the voltage drop of the Q node may be prevented, so that the voltage of the Q node may be stably maintained.

For example, when the threshold voltage of the first transistor T21 is negative polarity (−), the gate-source voltage Vgs of the first transistor T21 is maintained at the negative polarity (−) by the third high potential gate voltage GVDD3 supplied to the drain node.

Accordingly, when the first transistor T21 is turned off by the previous carry signal C(k−2) with a low level supplied to the gate node of the first transistor T21, the first transistor T21 remains completely turned off to prevent leakage current.

Here, the third high potential gate voltage GVDD3 is determined to a voltage level lower than the first high potential gate voltage GVDD1.

The third transistor T23 and the fourth transistor T24 are connected between the Q node and a third low potential gate voltage line transferring the third low potential gate voltage GVSS3. The third transistor T23 and the fourth transistor T24 are connected in series with each other.

In the tenth transistor T30, the touch control signal Tvst is supplied to a gate node, the rear carry signal C(k+2) is supplied to a drain node, and a source node is connected to gate nodes of the third transistor T23 and the fourth transistor T24 together. Accordingly, the tenth transistor T30 is turned on by the touch control signal Tvst, and the third transistor T23 and the fourth transistor T24 discharge the Q node and the QH node to a level of the third low potential gate voltage GVSS3 in response to the rear carry signal C(k+2) transmitted while the tenth transistor T30 is turned on.

The fourth transistor T24 is turned on by the rear carry signal C(k+2) to discharge the QH node to a level of the third low potential gate voltage GVSS3. The third transistor T23 is turned on by the rear carry signal C(k+2) to electrically connect the Q node and the QH node. Accordingly, when the third transistor T23 and the fourth transistor T24 are simultaneously turned on, the Q node and the QH node are discharged or reset to a level of the third low potential gate voltage GVSS3, respectively.

The seventh transistor T27 and the eighth transistor T28 are connected between the first high potential gate voltage line transmitting the first high potential gate voltage GVDD1 and the Q node, and connected between the first high potential gate voltage line transmitting the first high potential gate voltage GVDD1 and the QH node. The seventh transistor T27 and the eighth transistor T28 are connected in series with each other.

The seventh transistor T27 and the eighth transistor T28 supply the first high potential gate voltage GVDD1 to the QH node in response to the voltage of the Q node. The seventh transistor T27 is turned on by a high voltage of the Q node to supply the first high potential gate voltage GVDD1 to the common node of the seventh transistor T27 and the eighth transistor T28.

The eighth transistor T28 is turned on by a high voltage of the Q node to electrically connect the common node and the QH node. Accordingly, the seventh transistor T27 and the eighth transistor T28 are simultaneously turned on by high voltage of the Q node to supply the first high potential gate voltage GVDD1 to the QH node.

When the first high potential gate voltage GVDD1 is supplied to the QH node, a voltage difference between the gate node of the third transistor T23 and the QH node is increased. Accordingly, when the third transistor T23 is turned off by the rear carry signal C(k+2) with a low level supplied to the gate node of the third transistor T23, the third transistor T23 may be completely maintained in a turn-off state due to a voltage difference between the gate node of the third transistor T23 and the QH node. Accordingly, current leakage of the third transistor T23 and the voltage drop of the Q node are prevented, so that the voltage of the Q node may be stably maintained.

At this time, the gate driving integrated circuit may respectively generate scan signals SCAN(i), SCAN(i+1), SCAN(i+2), SCAN(i+3) with high-levels in accordance with scan clock signals SCCLK(i), SCCLK(i+1), SCCLK(i+2), SCCLK(i+3) with high levels when the voltage of the Q node is a high level.

That is, by controlling the operations of the first top fourth transistors T21-T24 that control the Q node of the gate driving integrated circuit, the display driving period DP and the touch driving the period TP of the touch display device 100 may be controlled.

Accordingly, the touch display device 100 of the present disclosure may control a time interval between the display driving period DP and the touch driving period TP by controlling the ninth transistor T29 for turning on the first transistor T21 and the second transistor T22 and the tenth transistor T30 for turning on the third transistor T23 and the fourth transistor T24 using the touch control signal Tvst.

The Q node stabilizing unit 506 discharges the Q node and the QH node to the level of the third low potential gate voltage GVSS3 in response to the voltage of the QB node. The Q node stabilizing unit 506 includes a first transistor T31 and a second transistor T32. The first transistor T31 and the second transistor T32 are connected between the Q node and a third low potential gate voltage line transmitting the third low potential gate voltage GVSS3. The first transistor T31 and the second transistor T32 are connected in series with each other.

The first transistor T31 and the second transistor T32 discharge the Q node and the QH node to a level of the third low potential gate voltage GVSS3 in response to the voltage of the QB node. The second transistor T32 is turned on by the QB node with a high voltage to supply the third low potential gate voltage GVSS3 to the common node of the first transistor T31 and the second transistor T32.

The first transistor T31 is turned on by the QB node with a high voltage to electrically connect the Q node and the QH node. Accordingly, when the first transistor T31 and the second transistor T32 are simultaneously turned on in response to the voltage of the QB node, the Q node and the QH node are respectively discharged or reset to the level of the third low potential gate voltage GVSS3.

The inverting unit 508 changes the voltage level of the QB node according to the voltage level of the Q node. The inverting unit 508 includes first to fifth transistors T41-T45.

The second transistor T42 and the third transistor T43 are connected between the second high potential gate voltage line transmitting the second high potential gate voltage GVDD2 and the third connection node NC3. The second transistor T42 and the third transistor T43 are connected in series with each other.

The second transistor T42 and the third transistor T43 supply the second high potential gate voltage GVDD2 to the third connection node NC3 in response to the second high potential gate voltage GVDD2. The second transistor T42 is turned on by the second high potential gate voltage GVDD2 to supply the second high potential gate voltage GVDD2 to a common node of the second transistor T42 and the third transistor T43.

The third transistor T43 is turned on by the second high potential gate voltage GVDD2 to electrically connect the common node of the second transistor T42 and the third transistor T43 and the third connection node NC3. Accordingly, when the second transistor T42 and the third transistor T43 are simultaneously turned on by the second high potential gate voltage GVDD2, the third connection node NC3 is charged with the level of the second high potential gate voltage GVDD2.

The fourth transistor T44 is connected between the third connection node NC3 and a second low potential gate voltage line transmitting the second low potential gate voltage GVSS2.

The fourth transistor T44 supplies the second low potential gate voltage GVSS2 to the third connection node NC3 in response to the voltage of the Q node. The fourth transistor T44 is turned on by the Q node with a high voltage to discharge or reset the third connection node NC3 to the second low potential gate voltage GVSS2.

The first transistor T41 is connected between the second high potential gate voltage line transmitting the second high potential gate voltage GVDD2 and the QB node.

The first transistor T41 supplies the second high potential gate voltage GVDD2 to the QB node in response to the voltage of the third connection node NC3. The first transistor T41 is turned on by a high voltage of the third connection node NC3 to charge the QB node to the level of the second high potential gate voltage GVDD2.

The fifth transistor T45 is connected between the QB node and a third low potential gate voltage line transmitting the third low potential gate voltage GVSS3.

The fifth transistor T45 supplies the third low potential voltage GVSS3 to the QB node in response to the voltage of the Q node. The fifth transistor T45 is turned on by the Q node with a high voltage to discharge or reset the QB node to a level of the third low potential gate voltage GVSS3.

The QB node stabilizing unit 510 discharges the QB node to the level of the third low potential gate voltage GVSS3 in response to the rear carry signal C(k−2), the reset signal RESET, and the charging voltage of the M node. The QB node stabilizing unit 510 includes first to third transistors T51 to T53.

The first transistor T51 is connected between the QB node and the third low potential gate voltage line transmitting the third low potential gate voltage GVSS3.

The first transistor T51 supplies the third low potential gate voltage GVSS3 to the QB node in response to the rear carry signal C(k−2).

The second transistor T52 and the third transistor T53 are connected between the QB node and the third low potential gate voltage line transmitting the third low potential gate voltage GVSS3. The second transistor T52 and the third transistor T53 are connected in series with each other.

The second transistor T52 and the third transistor T53 discharge the QB node to a level of the third low potential gate voltage GVSS3 in response to the reset signal RESET and the charging voltage of the M node.

The third transistor T53 is turned on by the M node with high voltage to supply the third low potential gate voltage GVSS3 to the common node of the second transistor T52 and the third transistor T53.

The second transistor T52 is turned on by the reset signal RESET to electrically connect the common node of the second transistor T52 and the third transistor T53 and the QB node. Accordingly, when the reset signal RESET is supplied while the voltage of the M node is at a high level, the second transistor T52 and the third transistor T53 are simultaneously turned on to discharge or reset the QB node to a level of the third low potential gate voltage GVSS3.

The carry signal generating unit 512 generates a carry signal C(k) having a voltage level of the carry clock signal CRCLK(k) or a level of the third low potential gate voltage GVSS3 according to a voltage level of the Q node or the QB node.

The carry signal generating unit 512 includes a first transistor T61, a second transistor T62, and a boosting capacitor CC.

The first transistor T61 is connected between a clock signal line transmitting the carry clock signal CRCLK(k) and a first output node NO1. The boosting capacitor CC is connected between a gate node and a source node of the first transistor T61.

The first transistor T61 generates the carry signal C(k) with a high level through the first output node NO1 based on the carry clock signal CRCLK(k) in response to the voltage of the Q node. The first transistor T61 is turned on by the Q node with a high level to supply the carry clock signal CRCLK(k) with a high level to the first output node NO1. Accordingly, the carry signal C(k) with a high level is generated.

When the carry signal C(k) is generated, the boosting capacitor CC adjusts the voltage of the Q node to a boosting voltage level higher than the level of the first high potential gate voltage GVDD1 in synchronization with the carry clock signal CRCLK(k) with a high level. When the voltage of the Q node is bootstrapped, the carry clock signal CRCLK(k) with a high level may be generated as the carry signal C(k) quickly and without distortion.

The second transistor T62 is connected between the first output node NO1 and the third low potential gate voltage line transmitting the third low potential gate voltage GVSS3.

The second transistor T62 generates a carry signal C(k) with low level through the first output node NO1 based on the third low potential gate voltage GVSS3 in response to a voltage of the QB node. The second transistor T62 is turned on by the voltage of the QB node with a high level to supply the third low potential voltage GVSS3 to the first output node NO1. Accordingly, the carry signal C(k) with low level is generated.

The scan signal generating unit 514 generates the plurality of scan signals SCAN(i), SCAN(i+1), SCAN(i+2), SCAN(i+3) (i is a positive integer) based on levels of a plurality of scan clock signals SCCLK(i), SCCLK(i+1), SCCLK(i+2), SCCLK(i+3) or the first low potential gate voltage GVSS1 according to the voltage level of the Q node or the QB node.

The scan signal generating unit 514 includes first to eighth transistors T71-T78 and boosting capacitors CS1, CS2, CS3, CS4.

The first transistor T71, the third transistor T73, the fifth transistor T75, and the seventh transistor T77 are connected between the clock signal line transmitting the scan clock signals SCCLK(i), SCCLK(i+1), SCCLK(i+2), SCCLK(i+3) and the second to fifth output nodes NO2-NO5.

The boosting capacitors CS1, CS2, CS3, CS4 are connected between the gate node and the source node of the first transistor T71, the third transistor T73, the fifth transistor T75, and the seventh transistor T77, respectively.

The first transistor T71, the third transistor T73, the fifth transistor T75, and the seventh transistor T77 generate respectively the scan signals SCAN(i), SCAN(i+1), SCAN(i+2), SCAN(i+3) with high level through the second output node NO2, the third output node NO3, the fourth output node N04, and the fifth output node NO5 based on the scan clock signals SCCLK(i), SCCLK(i+1), SCCLK(i+2), SCCLK(i+3) in response to the level of the Q node.

The first transistor T71, the third transistor T73, the fifth transistor T75, and the seventh transistor T77 are turned on by the Q node with high voltage to supply respectively the scan clock signals SCCLK(i), SCCLK(i+1), SCCLK(i+2), SCCLK(i+3) with high level to the second output node NO2, the third output node NO3, the fourth output node NO4 and the fifth output node N05. Accordingly, the scan signals SCAN(i), SCAN(i+1), SCAN(i+2), SCAN(i+3) with high level are respectively generated.

The first transistor T71, the third transistor T73, the fifth transistor T75, and the seventh transistor T77 correspond to pull-up transistors, respectively.

When the scan signals SCAN(i), SCAN(i+1), SCAN(i+2), SCAN(i+3) are generated, the boosting capacitors CS1, CS2, CS3, CS4 increase the voltage of the Q node to a boosting voltage level higher than the first high potential gate voltage GVDD1 in synchronization with the scan clock signals SCCLK(i), SCCLK(i+1), SCCLK(i+2), SCCLK(i+3). When the voltage at the Q node is bootstrapped, the scan clock signals SCCLK(i), SCCLK(i+1), SCCLK(i+2), SCCLK(i+3) with high level may be generated as the scan signals SCAN (i), SCAN(i+1), SCAN(i+2), SCAN(i+3) quickly and without distortion.

The second transistor T72, the fourth transistor T74, the sixth transistor T76, and the eighth transistor T78 generate respectively scan signals SCAN(i), SCAN(i+1), SCAN(i+2), SCAN(i+3) through the second output node NO2, the third output node NO3, the fourth output node N04, and the fifth output node NO5 based on the first low potential gate voltage GVSS1 in response to the voltage of the QB node.

The second transistor T72, the fourth transistor T74, the sixth transistor T76, and the eighth transistor T78 are turned on by the QB node with high voltage to supply respectively the first low potential gate voltage GVSS1 to the second output node NO2, the third output node NO3, the fourth output node N04, and the fifth output node NO5. Accordingly, the scan signals SCAN(i), SCAN(i+1), SCAN(i+2), SCAN(i+3) with low level are generated.

The second transistor T72, the fourth transistor T74, the sixth transistor T76, and the eighth transistor T78 correspond to pull-down transistors, respectively.

Here, it has illustrated a case that three high potential gate voltages GVDD1, GVDD2, GVDD3 determined to different levels in each stage circuit and three low potential gate voltages GVSS1, GVSS2, GVSS3 determined to different levels in each stage circuit are supplied. For example, the first high potential gate voltage GVDD1 may be determined to 20V, the second high potential gate voltage GVDD2 may be determined to 16V, and the third high potential gate voltage GVDD3 may be determined to 14V. Also, the first low potential gate voltage GVSS1 may be determined to −6V, the second low potential gate voltage GVSS2 may be determined to −10V, and the third low potential gate voltage GVSS3 may be determined to −12V. These figures are only an example, and the levels of the high potential gate voltage and the low potential gate voltage may be determined differently depending on the embodiments.

The touch display device 100 of the present disclosure may control the display driving period DP and the touch driving period TP by controlling the operations of the first to fourth transistors T21-T24 of the Q node controlling unit 504 in the gate driving integrated circuit. Accordingly, the touch display device 100 of the present disclosure may change a time interval between the display driving period DP and the touch driving period TP by controlling the operations of the ninth transistor T29 and the tenth transistor T30 arranged in the Q node controlling unit 504 using the touch control signal Tvst generated by the timing controller 140.

As a result, the touch display device 100 of the present disclosure may switch the VB driving mode to the LHB driving mode or switch the LHB driving mode to the VB driving mode by controlling the time interval between the display driving period DP and the touch driving period TP. In addition, the touch display device 100 of the present disclosure may control the number of LHB periods included in one display frame period by controlling the time interval between the display driving period DP and the touch driving period TP.

Figure 12:
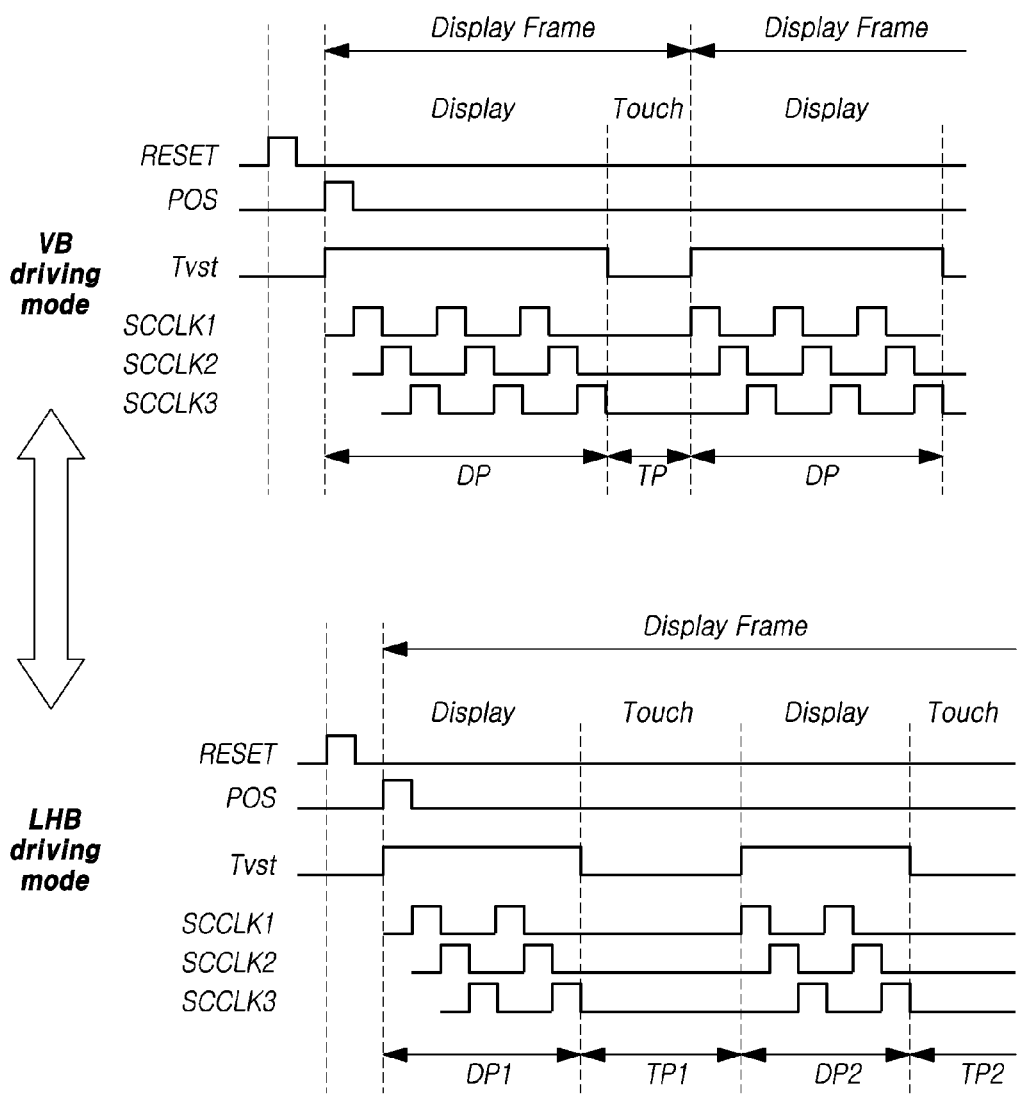
FIG. 12 illustrates a diagram of a signal waveform when a VB driving mode and an LHB driving mode are switched using a touch control signal in a touch display device according to embodiments of the present disclosure.

FIG. 12 illustrates a diagram of a signal waveform when a VB driving mode and an LHB driving mode are switched using a touch control signal in a touch display device according to embodiments of the present disclosure.

Referring to FIG. 12, the touch display device 100 according to embodiments of the present disclosure may control the time interval of the display driving period DP and the touch driving period TP using the touch control signal Tvst generated by the timing controller 140. As a result, the touch display device 100 may switch the VB driving mode to the LHB driving mode or the LHB driving mode to the VB driving mode.

For example, the touch control signal Tvst generated by the timing controller 140 may be supplied to the gate nodes of the ninth transistor T29 and the tenth transistor T30 disposed in the Q node controlling unit 504 of the gate driving circuit 120.

The Q node controlling unit 504 of the gate driving integrated circuit charges the Q node to a level of the first high potential gate voltage GVDD1 in response to the previous carry signal C(k−2).

At this time, since the ninth transistor T29 and the tenth transistor T30 disposed in the Q node controlling unit 504 are turned on in a period in which the touch control signal Tvst is supplied at a high level, the Q node of the gate driving integrated circuit is charged to the level of the first high potential gate voltage GVDD1 to generate the scan signal SCAN with high level while the touch control signal Tvst is supplied at the high level.

On the other hand, since the ninth transistor T29 and the tenth transistor T30 disposed in the Q node controlling unit 504 are turned off during a period in which the touch control signal Tvst is supplied at a low level, the Q node of the gate driving integrated circuit hold the scan signal SCAN while the touch control signal Tvst is supplied at a low level.

At this time, in order to generate the scan signal SCAN with high level during the period in which the touch control signal Tvst is supplied at the high level, it is necessary to control the scan clock signal SCCLK for generating the scan signal SCAN so that the touch control signal Tvst is supplied at the high level. That is, the timing controller 140 may control the time interval between the display driving period DP and the touch driving period TP by generating the scan signal SCAN during the period in which the touch control signal Tvst is supplied at the high level, and by blocking the scan clock signal SCCLK during the period in which the touch control signal Tvst is supplied at the low level.

Here, it illustrates a case that three scan clock signals SCCLK are transmitted while the touch control signal Tvst is supplied at a high level in the VB driving mode of the touch display device 100, and two scan clock signals SCCLK are transmitted while the touch control signal Tvst is supplied at a high level in the LHB driving mode of the touch display device 100.

Meanwhile, the touch control signal Tvst may be supplied at a high level during the display driving period DP and at a low level during the touch driving period TP. That is, the touch control signal Tvst may have same waveform as the touch synchronization signal Tsync supplied from the timing controller 140 to the touch driving circuit 150.

Accordingly, the touch display device 100 of the present disclosure may supply the touch synchronization signal Tsync to the gate nodes of the ninth transistor T29 and the tenth transistor T30 of the Q node controlling unit 504 in order to control the time interval between the display driving period DP and the touch driving period TP.

In addition, the touch display device 100 of the present disclosure may control the number of LHB s included within one display frame period at the LHB driving mode by controlling the time interval between the display driving period DP and the touch driving period TP.

Figure 13:
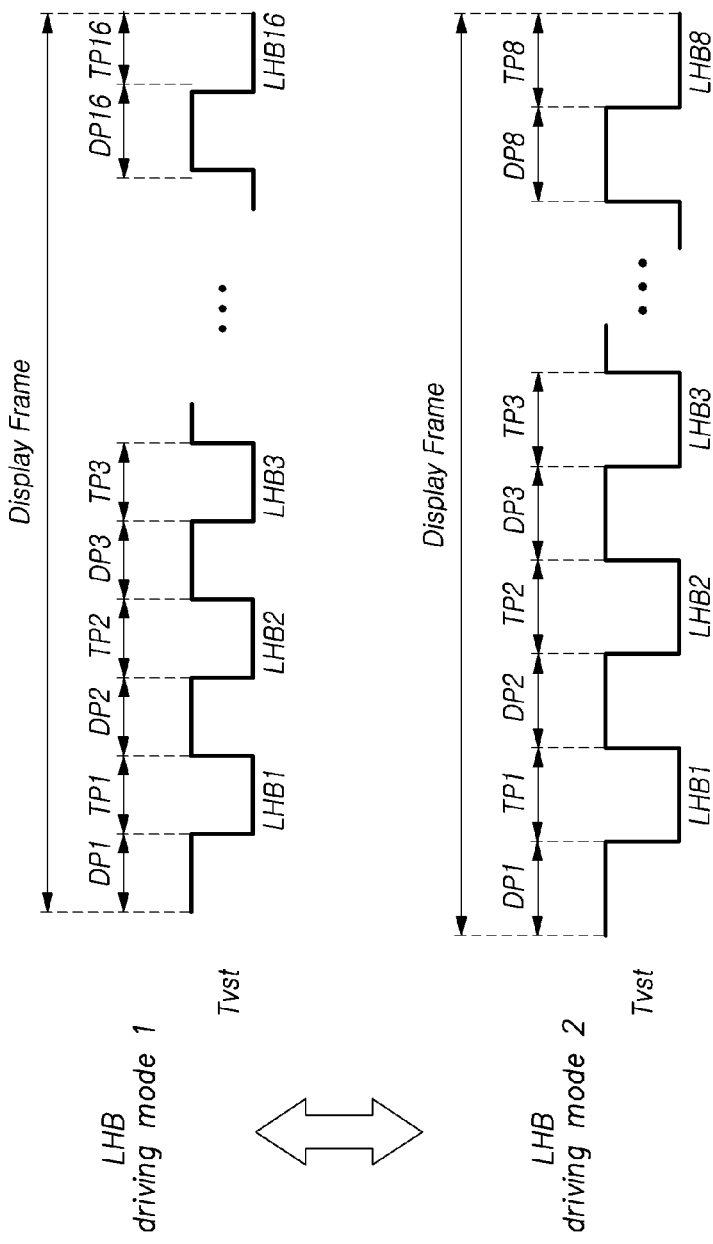
FIG. 13 illustrates an example diagram of controlling the number of LHBs in an LHB driving mode using a touch control signal in a touch display device according to embodiments of the present disclosure.

FIG. 13 illustrates an example diagram of controlling the number of LHBs in an LHB driving mode using a touch control signal in a touch display device according to embodiments of the present disclosure.

Referring to FIG. 13, the touch display device 100 according to embodiments of the present disclosure may control the time interval of the display driving period DP and touch driving period TP using the touch control signal Tvst generated by the timing controller 140. As a result, the touch display device 100 may control the number of LHBs included in one display frame period at the LHB driving mode.

For example, the touch control signal Tvst generated by the timing controller 140 may supplied to the gate nodes of the ninth transistor T29 and the tenth transistor T30 disposed in the Q node controlling unit 504 of the gate driving circuit 120.

The Q node controlling unit 504 of the gate driving integrated circuit charges the Q node to the level of the first high potential gate voltage GVDD1 in response to the previous carry signal C(k−2).

At this time, since the ninth transistor T29 and the tenth transistor T30 disposed in the Q node controlling unit 504 are turned on while the touch control signal Tvst is supplied at a high level, the Q node of the gate driving integrated circuit is charged to the level of the first high potential gate voltage GVDD1 to generate the scan signal SCAN with high level while the touch control signal Tvst is supplied at the high level.

On the other hand, since the ninth transistor T29 and the tenth transistor T30 disposed in the Q node controlling unit 504 are turned off while the touch control signal Tvst is supplied at a low level, the Q node of the gate driving integrated circuit hold the scan signal SCAN while the touch control signal Tvst is supplied at a low level.

At this time, in order to generate the scan signal SCAN with high level while the touch control signal Tvst is supplied at the high level, it is necessary to control the scan clock signal SCCLK for generating the scan signal SCAN so that the touch control signal Tvst is supplied at the high level. That is, the timing controller 140 may control the time interval between the display driving period DP and the touch driving period TP by generating the scan signal SCAN while the touch control signal Tvst is supplied at the high level, and by blocking the scan clock signal SCCLK while the touch control signal Tvst is supplied at the low level.

Here, it illustrates a case that a first LHB driving mode including 16 LHBs in one display frame and a second LHB driving mode including 8 LHB s in one display frame are switched to each other in the LHB driving mode.

Figure 14:
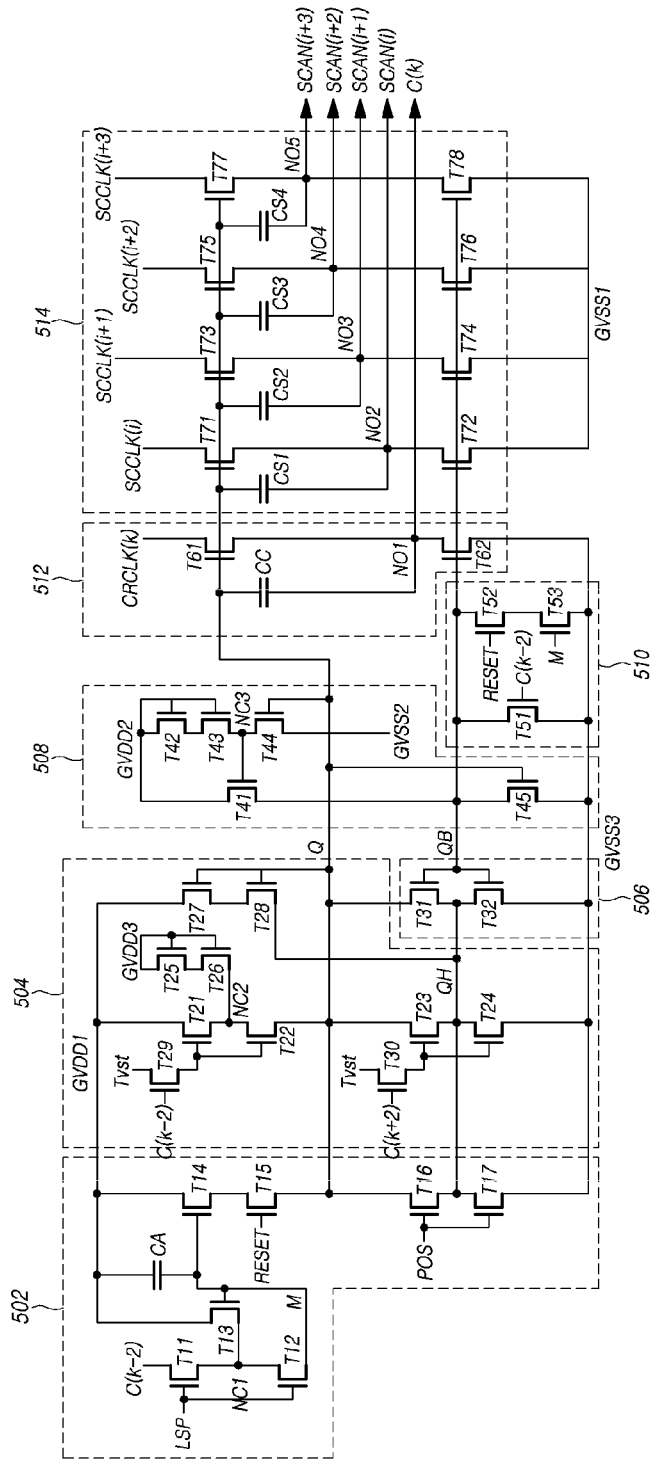
FIG. 14 illustrates another example of a gate driving integrated circuit constituting a gate driving circuit in a touch display device according to embodiments of the present disclosure.

FIG. 14 illustrates another example of a gate driving integrated circuit constituting a gate driving circuit in a touch display device according to embodiments of the present disclosure.

Referring to FIG. 14, a gate driving integrated circuit GDIC according to embodiments of the present disclosure may include an M node, a Q node, and a QB node, and include a line selecting unit 502, a Q node controlling unit 504, a Q node stabilizing unit 506, an inverting unit 508, a QB node stabilizing unit 510, a carry signal generating unit 512, and a scan signal generating unit 514. As used herein, the term "unit" may refer to a circuit structure or a portion thereof.

Here, the line selecting unit 502, the Q node stabilizing unit 506, the inverting unit 508, the QB node stabilizing unit 510, the carry signal generating unit 512, and the scan signal generating unit 514 are same as in FIG. 11, only the position to which the touch control signal Tvst is supplied in the Q node controlling unit 504 may be different.

For example, in the ninth transistor T29 of the Q node controlling unit 506, the previous carry signal C(k−2) may be supplied to the gate node and the touch control signal Tvst may be supplied to the drain node, and the source node may be connected together to the gate nodes of the first transistor T21 and the second transistor T22. Accordingly, the ninth transistor T29 is turned on by the previous carry signal C(k−2), and the first transistor T21 and the second transistor T22 charge the Q node to a level of the first high potential gate voltage GVDD1 in response to the touch control signal Tvst transmitted in the turn-on state of the ninth transistor T29.

In addition, in the tenth transistor T30, the rear carry signal C(k+2) is supplied to the gate node, the touch control signal Tvst is supplied to the drain node, and the source node is connected together to the gate nodes of the third transistor T23 and the fourth transistor T24. Accordingly, the tenth transistor T30 is turned on by the rear carry signal C(k+2), and the third transistor T23 and the fourth transistor T24 may discharge the Q node and the QH node to a level of the third low potential gate voltage GVSS3 in response to the touch control signal Tvst transmitted in the turn-on state of the tenth transistor T30.

In this way, the position of the touch control signal Tvst and the carry signals C(k−2), C(k+2) may be exchanged since a period in which the touch control signal Tvst is supplied at a high level is same to the display driving period DP in which the scan signal SCAN is generated and thus a period in which the previous carry signal C(k−2) and the rear carry signal C(k+2) generated by the scan signal SCAN are supplied is same to a period in which the touch control signal Tvst is supplied at the high level.

It is to be noted that FIGS. 11 and 14 only shows two examples of a part of circuit diagram of the gate driving integrated circuit constituting the gate driving circuit in the touch display device, and embodiments of the present disclosure is not limited thereto.

Figure 15:
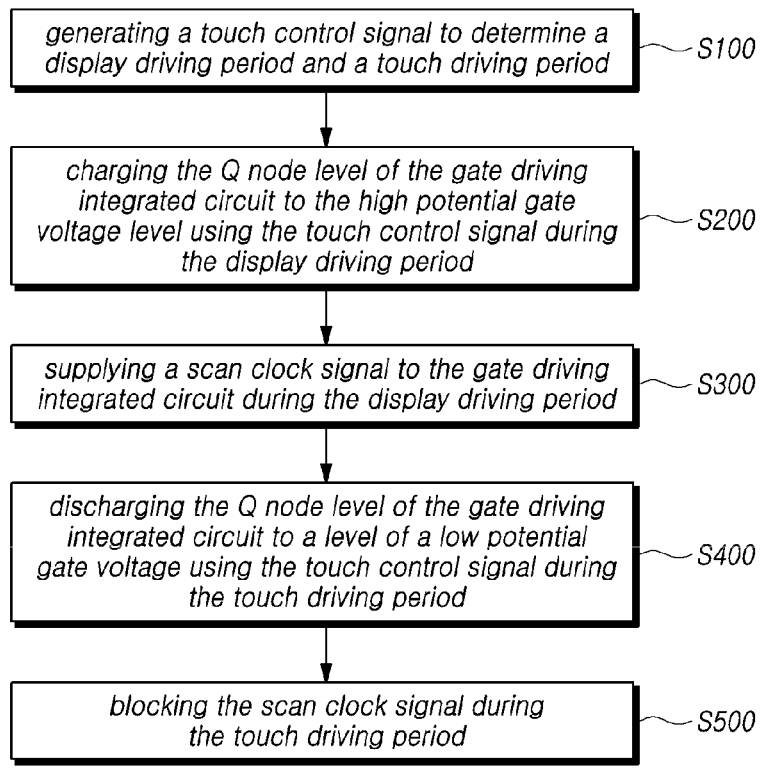
FIG. 15 illustrates a flowchart of a touch driving method according to embodiments of the present disclosure.

FIG. 15 illustrates a flowchart of a touch driving method according to embodiments of the present disclosure.

Referring to FIG. 15, the touch driving method according to embodiments of the present disclosure may include a step S100 for generating a touch control signal Tvst to determine a display driving period DP and a touch driving period TP, a step 200 for charging the Q node level of the gate driving integrated circuit to a level of the high potential gate voltage GVDD using the touch control signal Tvst during the display driving period DP, a step S300 for supplying a scan clock signal SCCLK to the gate driving integrated circuit during the display driving period DP, a step S400 for discharging the Q node level of the gate driving integrated circuit to a level of a low potential gate voltage GVSS using the touch control signal Tvst during the touch driving period TP, and a step S500 for blocking the scan clock signal SCCLK during the touch driving period TP.

The step S100 for generating a touch control signal Tvst to determine a display driving period DP and a touch driving period TP is a process in which the timing controller 140 generates a touch control signal Tvst with different levels in the display driving period DP and the touch driving period TP.

The touch control signal Tvst may indicate a VB driving mode including one display driving period DP and one touch driving period TP within one display frame period, and an LHB driving mode including a plurality of display driving periods DP and a plurality of touch driving periods TP within one display frame period.

Also, the display driving period DP and the touch driving period TP of the touch control signal Tvst may vary.

The touch control signal Tvst may be a touch synchronization signal Tsync or a signal generated differently from the touch synchronization signal Tsync.

The touch control signal Tvst is supplied to the Q node controlling unit 504 of the gate driving integrated circuit constituting the gate driving circuit 120 to make the Q node of the gate driving integrated circuit have a level of the high potential gate voltage GVDD or the low potential gate voltage GVSS.

The step 200 for charging the Q node level of the gate driving integrated circuit to a level of the high potential gate voltage GVDD using the touch control signal Tvst during the display driving period DP is a process in which the Q node level of the gate driving integrated circuit is charged to a level of the high potential gate voltage GVDD during the display driving period DP in which the touch control signal Tvst is supplied at a high level.

The step S300 for supplying a scan clock signal SCCLK to the gate driving integrated circuit during the display driving period DP is a process of supplying the scan clock signal SCCLK to the gate driving integrated circuit during the display driving period DP in which the touch control signal Tvst is supplied at a high level. The timing controller 140 may supply the touch control signal Tvst at a high label during the display driving period DP and simultaneously supply the scan clock signal SCCLK to the gate driving integrated circuit.

Accordingly, the gate driving integrated circuit generates a scan signal SCAN during the display driving period DP since the Q node level of the gate driving integrated circuit is charged to a level of the high potential gate voltage GVDD by the touch control signal Tvst with a high level and the scan clock signal SCCLK Since is supplied.

The step S400 for discharging the Q node level of the gate driving integrated circuit to a level of a low potential gate voltage GVSS using the touch control signal Tvst during the touch driving period TP is a process in which the Q node level of the gate driving integrated circuit is discharged to a level of the low potential gate voltage GVDD during the touch driving period TP in which the touch control signal Tvst is supplied at a low level.

The step S500 for blocking the scan clock signal SCCLK during the touch driving period TP is a process in which the timing controller 140 stops the output of the scan clock signal SCCLK during the touch driving period TP in which the touch control signal Tvst is supplied at a low level.

Accordingly, the gate driving integrated circuit does not generate the scan signal SCAN during the touch driving period TP since the Q node level of the gate driving integrated circuit is discharged to a level of the low potential gate voltage GVSS by the touch control signal Tvst with a low level and the scan clock signal SCCLK is not supplied.

As described above, the touch display device 100 of the present disclosure may switch between the VB driving mode and the LHB driving mode or control the time interval between the display driving period DP and the touch driving period TP in the LHB driving mode by supplying the touch control signal Tvst capable of varying the display driving period DP and the touch driving period TP to the gate driving circuit 120 and by supplying the scan clock signal SCCLK only during the display driving period DP.

A brief description of the embodiments of the present disclosure described above is as follows.

A touch display device 100 according to embodiments of the present disclosure may include a display panel 110 on which a plurality of subpixels SP are disposed, a gate driving circuit 120 supplying a plurality of scan signals SCAN to the display panel 110 through a plurality of gate lines GL, a touch driving circuit 150 supplying a plurality of touch driving signals to the display panel 110 through a plurality of touch lines TL and receiving a plurality of touch sensing signals generated by the display panel 110, and a timing controller 140 controlling the touch driving circuit 150 and controlling a plurality of driving modes by supplying a touch control signal Tvst for determining a display driving period DP and a touch driving period TP to the gate driving circuit 120.

The touch control signal Tvst may be a signal in which the display driving period DP and the touch driving period TP are variable.

The touch control signal Tvst may be a touch synchronization signal Tsync.

The plurality of driving modes may include a VB driving mode including one display driving period DP and one touch driving period TP within one display frame period, and an LHB driving mode including a plurality of display driving periods DP and a plurality of touch driving periods TP within one display frame period.

The plurality of driving modes may include a first LHB driving mode including a first number of display driving periods DP and a first number of touch driving periods TP within one display frame period, and a second LHB driving mode including a second number of display driving periods DP and a second number of touch driving periods TP within one display frame period.

The gate driving circuit 120 may include a plurality of gate driving integrated circuits GDIC, and the gate driving integrated circuit GDIC may include a line selecting unit 502 configured to charge an M node based on a previous carry signal in response to the line sensing preparation signal LSP, a Q node controlling unit 504 configured to charge a Q node to a level of a first high potential gate voltage GVDD1 in response to the touch control signal Tvst and the previous carry signal, and configured to discharge the Q node to a level of a third low potential gate voltage GVSS3 in response to the touch control signal Tvst and a rear carry signal, a Q node stabilizing unit 506 configured to discharge the Q node and a QH node to a level of the third low potential gate voltage GVSS3 in response to a voltage of the QB node, an inverting unit 508 configured to change the voltage level of the QB node according to a voltage level of the Q node, a QB node stabilizing unit 510 configured to discharge the QB node to a level of the third low potential gate voltage GVSS3 in response to the rear carry signal, a reset signal, and a charging voltage of the M node, a carry signal generating unit 512 configured to generate a carry signal having a voltage level of a carry clock signal CRCLK or a level of the third low potential gate voltage GVSS3 according to a voltage level of the Q node or a voltage level of the QB node, and a scan signal generating unit 514 configured to generate the plurality of scan signals SCAN based on voltage levels of a plurality of scan clock signals SCCLK or a level of a first low potential gate voltage GVSS1 according to a voltage level of the Q node or a voltage level of the QB node.

The Q node controlling unit 504 may include a first transistor T21 and a second transistor T22 connected in series between a first high potential gate voltage line transmitting the first high potential gate voltage GVDD1 and the Q node, a third transistor T23 and a fourth transistor T24 connected in series between a third low potential gate voltage line transmitting the third low potential gate voltage GVSS3 and the Q node, a fifth transistor T25 and a sixth transistor T26 connected in series to the third high potential gate voltage line, a seventh transistor T27 and eighth transistor T28 connected in series between the first high potential gate voltage line and the Q node and between the first high potential gate voltage line and the QH node, a ninth transistor T29 to which the touch control signal Tvst is supplied to a gate node, the previous carry signal is supplied to a drain node, and a source node is connected together to gate nodes of the first transistor T21 and the second transistor together T22, and a tenth transistor T30 to which the touch control signal Tvst is supplied to a gate node, the rear carry signal is supplied to a drain node, and a source node is connected together to the gate nodes of the third transistor T23 and the fourth transistor T24.

The Q node controlling unit 504 may include a first transistor T21 and a second transistor T22 connected in series between a first high potential gate voltage line transmitting the first high potential gate voltage GVDD1 and the Q node, a third transistor T23 and a fourth transistor T24 connected in series between a third low potential gate voltage line transmitting the third low potential gate voltage GVSS3 and the Q node, a fifth transistor T25 and a sixth transistor T26 connected in series to the third high potential gate voltage line, a seventh transistor T27 and eighth transistor T28 connected in series between the first high potential gate voltage line and the Q node and between the first high potential gate voltage line and the QH node, a ninth transistor T29 to which the previous carry signal is supplied to a gate node, the touch control signal Tvst is supplied to a drain node, and a source node is connected together to gate nodes of the first transistor T21 and the second transistor T22 together, and a tenth transistor T30 to which the rear carry signal is supplied to a gate node, the touch control signal Tvst is supplied to a drain node, and a source node is connected together to the gate nodes of the third transistor T23 and the fourth transistor T24.

The timing controller 140 may supply the plurality of scan clock signals SCCLK to the gate driving circuit 120 during the display driving period DP, and blocks the plurality of scan clock signals SCCLK during the touch driving period TP.

In addition, a gate driving circuit 120 configured to supply a plurality of scan signals SCAN through a plurality of gate lines GL to a display panel 110 in which a plurality of subpixels SP are disposed according to embodiments of the present disclosure may include a plurality of gate driving integrated circuits GDIC, wherein the plurality of gate driving integrated circuits GDIC varies a time interval at which the plurality of scan signals SCAN are generated according to a plurality of driving modes by a touch control signal Tvst for determining a display driving period DP and a touch driving period TP.

In addition, a touch driving method controlling a plurality of driving modes according to embodiments of the present disclosure may include generating a touch control signal Tvst to determine a display driving period DP and a touch driving period TP, charging a Q node level of a gate driving integrated circuit GDIC to a level of a high potential gate voltage using the touch control signal Tvst during the display driving period DP, supplying a scan clock signal SCCLK to the gate driving integrated circuit GDIC during the display driving period DP, discharging the Q node level of the gate driving integrated circuit GDIC to a level of a low potential gate voltage GVSS using the touch control signal Tvst during the touch driving period Tp, and blocking the scan clock signal SCCLK during the touch driving period TP.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed in such a manner that all of the technical ideas included within the scope of the claims and equivalents thereof are within the present disclosure The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A touch display device, comprising:
a display panel on which a plurality of subpixels is disposed;
a gate driving circuit supplying a plurality of scan signals to the display panel through a plurality of gate lines;
a touch driving circuit supplying a plurality of touch driving signals to the display panel through a plurality of touch lines and receiving a plurality of touch sensing signals generated by the display panel; and
a timing controller controlling the touch driving circuit and controlling a plurality of driving modes by supplying a touch control signal for determining a display driving period and a touch driving period to the gate driving circuit,
wherein the gate driving circuit includes a plurality of gate driving integrated circuits; and
each of the plurality of gate driving integrated circuits includes:
a line selecting circuit configured to charge an M node based on a previous carry signal in response to a line sensing preparation signal;
a Q node controlling circuit configured to charge a Q node to a level of a first high potential gate voltage in response to the touch control signal and the previous carry signal, and configured to discharge the Q node to a level of a third low potential gate voltage in response to the touch control signal and a rear carry signal;
a Q node stabilizing circuit configured to discharge the Q node and a QH node to a level of the third low potential gate voltage in response to a voltage of the QB node;
an inverting circuit configured to change the voltage level of the QB node according to a voltage level of the Q node;
a QB node stabilizing circuit configured to discharge the QB node to a level of the third low potential gate voltage in response to the rear carry signal, a reset signal, and a charging voltage of the M node;
a carry signal generating circuit configured to generate a carry signal having a voltage level of a carry clock signal or a level of the third low potential gate voltage according to a voltage level of the Q node or a voltage level of the QB node; and
a scan signal generating circuit configured to generate the plurality of scan signals having voltage levels of a plurality of scan clock signals or a level of a first low potential gate voltage according to a voltage level of the Q node or a voltage level of the QB node.

2. The touch display device according to claim 1, wherein the touch control signal is a signal in which the display driving period and the touch driving period are variable.

3. The touch display device according to claim 1, wherein the touch control signal is same as a touch synchronization signal provided to the touch driving circuit.

4. The touch display device according to claim 1, wherein the plurality of driving modes include:
- a first driving mode including one display driving period and one touch driving period within one display frame period; and
- a second driving mode including a plurality of display driving periods and a plurality of touch driving periods within one display frame period.

5. The touch display device according to claim 1, wherein the plurality of driving modes include:
- a third driving mode including a first number of display driving periods and a first number of touch driving periods within one display frame period; and
- a fourth driving mode including a second number of display driving periods and a second number of touch driving periods within one display frame period.

6. The touch display device according to claim 1, wherein the Q node controlling circuit includes:
- a first transistor and a second transistor connected in series between a first high potential gate voltage line transmitting the first high potential gate voltage and the Q node;
- a third transistor and a fourth transistor connected in series between a third low potential gate voltage line transmitting the third low potential gate voltage and the Q node;
- a fifth transistor and a sixth transistor connected in series to a third high potential gate voltage line;
- a seventh transistor and eighth transistor connected in series between the first high potential gate voltage line and the Q node and between the first high potential gate voltage line and the QH node;
- a ninth transistor to which the touch control signal is supplied to a gate node, the previous carry signal is supplied to a drain node, and a source node is connected together to gate nodes of the first transistor and the second transistor; and
- a tenth transistor to which the touch control signal is supplied to a gate node, the rear carry signal is supplied to a drain node, and a source node is connected together to the gate nodes of the third transistor and the fourth transistor.

7. The touch display device according to claim 1, wherein the Q node controlling circuit includes:
- a first transistor and a second transistor connected in series between a first high potential gate voltage line transmitting the first high potential gate voltage and the Q node;
- a third transistor and a fourth transistor connected in series between a third low potential gate voltage line transmitting the third low potential gate voltage and the Q node;
- a fifth transistor and a sixth transistor connected in series to a third high potential gate voltage line;
- a seventh transistor and eighth transistor connected in series between the first high potential gate voltage line and the Q node and between the first high potential gate voltage line and the QH node;
- a ninth transistor to which the previous carry signal is supplied to a gate node, the touch control signal is supplied to a drain node, and a source node is connected together to gate nodes of the first transistor and the second transistor; and
- a tenth transistor to which the rear carry signal is supplied to a gate node, the touch control signal is supplied to a drain node, and a source node is connected together to the gate nodes of the third transistor and the fourth transistor.

8. The touch display device according to claim 1, wherein the timing controller supplies the plurality of scan clock signals to the gate driving circuit during the display driving period, and blocks the plurality of scan clock signals during the touch driving period.

9. A gate driving circuit configured to supply a plurality of scan signals through a plurality of gate lines to a display panel in which a plurality of subpixels are disposed, comprising:
- a plurality of gate driving integrated circuits;
- wherein the plurality of gate driving integrated circuits varies a time interval at which the plurality of scan signals are generated according to a plurality of driving modes by a touch control signal for determining a display driving period and a touch driving period,
- wherein each of the plurality of gate driving integrated circuit includes:
  - a line selecting circuit configured to charge an M node based on a previous carry signal in response to a line sensing preparation signal;
  - a Q node controlling circuit configured to charge a Q node to a level of a first high potential gate voltage in response to the touch control signal and the previous carry signal, and configured to discharge the Q node to a level of a third low potential gate voltage in response to the touch control signal and a rear carry signal;
  - a Q node stabilizing circuit configured to discharge the Q node and a QH node to a level of the third low potential gate voltage in response to a voltage of the QB node;
  - an inverting circuit configured to change the voltage level of the QB node according to a voltage level of the Q node;
  - a QB node stabilizing circuit configured to discharge the QB node to a level of the third low potential gate voltage in response to the rear carry signal, a reset signal, and a charging voltage of the M node;
  - a carry signal generating circuit configured to generate a carry signal having a voltage level of a carry clock signal or a level of to third low potential gate voltage according to a voltage level of the Q node or a voltage level of the QB node; and
  - a scan signal generating circuit configured to generate the plurality of scan signals having voltage levels of a plurality of scan clock signals or a level of a first low potential gate voltage according to a voltage level of the Q node or a voltage level of the QB node.

10. The gate driving circuit according to claim 9, wherein the Q node controlling circuit includes:
- a first transistor and a second transistor connected in series between a first high potential gate voltage line transmitting the first high potential gate voltage and the Q node;
- a third transistor and a fourth transistor connected in series between a third low potential gate voltage line transmitting the third low potential gate voltage and the Q node;

a fifth transistor and a sixth transistor connected in series to a third high potential gate voltage line;
a seventh transistor and eighth transistor connected in series between the first high potential gate voltage line and the Q node and between the first high potential gate voltage line and the QH node;
a ninth transistor to which the touch control signal is supplied to a gate node, the previous carry signal is supplied to a drain node, and a source node is connected together to gate nodes of the first transistor and the second transistor; and
a tenth transistor to which the touch control signal is supplied to a gate node, the rear carry signal is supplied to a drain node, and a source node is connected together to the gate nodes of the third transistor and the fourth transistor.

11. The gate driving circuit according to claim 9, wherein the Q node controlling circuit includes:
a first transistor and a second transistor connected in series between a first high potential gate voltage line transmitting the first high potential gate voltage and the Q node;
a third transistor and a fourth transistor connected in series between a third low potential gate voltage line transmitting the third low potential gate voltage and the Q node;
a fifth transistor and a sixth transistor connected in series to a third high potential gate voltage line;
a seventh transistor and eighth transistor connected in series between the first high potential gate voltage line and the Q node and between the first high potential gate voltage line and the QH node;
a ninth transistor to which the previous carry signal is supplied to a gate node, the touch control signal is supplied to a drain node, and a source node is connected together to gate nodes of the first transistor and the second transistor; and
a tenth transistor to which the rear carry signal is supplied to a gate node, the touch control signal is supplied to a drain node, and a source node is connected together to the gate nodes of the third transistor and the fourth transistor.

12. The gate driving circuit according to claim 9, wherein the plurality of scan clock signals are supplied during the display driving period, and blocked during the touch driving period.

13. A touch driving method controlling a plurality of driving modes, comprising:
generating a touch control signal to determine a display driving period and a touch driving period;
charging a Q node level of a gate driving integrated circuit to a level of a high potential gate voltage using the touch control signal during the display driving period;
supplying a scan clock signal to the gate driving integrated circuit during the display driving period; and
discharging the Q node level of the gate driving integrated circuit to a level of a low potential gate voltage using the touch control signal during the touch driving period, wherein the gate driving integrated circuit includes:
a line selecting circuit configured to charge an M node based on a previous carry signal in response to a line sensing preparation signal;
a Q node controlling circuit configured to charge a Q node to a level of a first high potential gate voltage in response to the touch control signal and the previous carry signal, and configured to discharge the Q node to a level of a third low potential gate voltage in response to the touch control signal and a rear carry signal;
a Q node stabilizing circuit configured to discharge the Q node and a QH node to a level of the third low potential gate voltage in response to a voltage of the QB node;
an inverting circuit configured to change the voltage level of the QB node according to a voltage level of the Q node;
a QB node stabilizing circuit configured to discharge the QB node to a level of the third low potential gate voltage in response to the rear carry signal, a reset signal, and a charging voltage of the M node;
a carry signal generating circuit configured to generate a carry signal having a voltage level of a carry clock signal or a level of the third low potential gate voltage according to a voltage level of the Q node or a voltage level of the QB node; and
a scan signal generating circuit configured to generate the plurality of scan signals having voltage levels of a plurality of scan clock signals or a level of a first low potential gate voltage according to a voltage level of the Q node or a voltage level of the QB node.

14. The touch driving method according to claim 13, further comprising:
blocking the scan clock signal during the touch driving period.

15. The touch driving method according to claim 13, wherein the touch control signal is a signal in which the display driving period and the touch driving period are variable.

16. The touch driving method according to claim 13, wherein the plurality of driving modes include:
a first driving mode including one display driving period and one touch driving period within one display frame period; and
a second driving mode including a plurality of display driving periods and a plurality of touch driving periods within one display frame period.

17. The touch driving method according to claim 13, wherein the plurality of driving modes include:
a third driving mode including a first number of display driving periods and a first number of touch driving periods within one display frame period; and
a fourth driving mode including a second number of display driving periods and a second number of touch driving periods within one display frame period.

* * * * *